(12) United States Patent
Cha et al.

(10) Patent No.: US 10,635,531 B2
(45) Date of Patent: Apr. 28, 2020

(54) SEMICONDUCTOR MEMORY DEVICE ERROR CORRECTION CIRCUIT, SEMICONDUCTOR MEMORY DEVICE INCLUDING THE SAME, AND MEMORY SYSTEM INCLUDING THE SAME

(71) Applicant: SAMSUNG ELECTRONICS CO., LTD., Suwon-si, Gyeonggi-do (KR)

(72) Inventors: Sang-Uhn Cha, Yongin-si (KR); Myeong-O Kim, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 52 days.

(21) Appl. No.: 15/870,220

(22) Filed: Jan. 12, 2018

(65) Prior Publication Data

US 2019/0012229 A1 Jan. 10, 2019

(30) Foreign Application Priority Data

Jul. 6, 2017 (KR) .......................... 10-2017-0085809

(51) Int. Cl.
| | | |
|---|---|---|
| *G06F 11/10* | (2006.01) | |
| *G11C 29/52* | (2006.01) | |
| *G11C 29/00* | (2006.01) | |
| *G11C 29/04* | (2006.01) | |

(52) U.S. Cl.
CPC ...... *G06F 11/1068* (2013.01); *G06F 11/1048* (2013.01); *G11C 29/52* (2013.01); *G11C 29/72* (2013.01); *G11C 2029/0409* (2013.01); *G11C 2029/0411* (2013.01)

(58) Field of Classification Search
CPC .. G06F 11/1068; G06F 11/1048; G11C 29/72; G11C 29/52; G11C 2029/0409; G11C 2029/0411
USPC ........................................................ 714/764
See application file for complete search history.

(56) References Cited

U.S. PATENT DOCUMENTS

| | | | | |
|---|---|---|---|---|
| 5,691,994 A | * | 11/1997 | Acosta ............... | G11B 20/1866 714/758 |
| 7,856,588 B2 | | 12/2010 | Christenson | |
| 8,091,010 B2 | | 1/2012 | Yim | |
| 8,516,354 B2 | | 8/2013 | Yang | |

(Continued)

FOREIGN PATENT DOCUMENTS

KR 1020160050961 5/2016

*Primary Examiner* — James C Kerveros
(74) *Attorney, Agent, or Firm* — F. Chau & Associates, LLC

(57) ABSTRACT

An error correction circuit of a semiconductor memory device including a memory cell array includes an error correction code (ECC) memory that stores an ECC and an ECC engine. The ECC is represented by a generation matrix. The ECC engine generates first parity data based on main data using the ECC, and corrects at least one error bit in the main data read from the memory cell array using the first parity data. The main data includes a plurality of data bits divided into a plurality of sub codeword groups. The ECC includes a plurality of column vectors divided into a plurality of code groups corresponding to the sub codeword groups. The column vectors have elements configured to restrict a location of a sub codeword group in which a mis-corrected bit occurs, in which the mis-corrected bit is generated due to error bits in the main data.

16 Claims, 25 Drawing Sheets

(56) References Cited

U.S. PATENT DOCUMENTS

| | | | |
|---|---|---|---|
| 8,996,950 B2* | 3/2015 | Desireddi | G06F 11/1012 |
| | | | 714/758 |
| 9,086,997 B2 | 7/2015 | Dodson et al. | |
| 9,136,873 B2 | 9/2015 | Pangal et al. | |
| 9,559,727 B1* | 1/2017 | Kumar | H03M 13/2975 |
| 9,690,517 B2* | 6/2017 | Zhang | G06F 3/0619 |
| 9,805,827 B2* | 10/2017 | Son | G11C 29/4401 |
| 2007/0143659 A1* | 6/2007 | Ball | H03M 13/15 |
| | | | 714/755 |
| 2013/0227374 A1* | 8/2013 | Desireddi | G06F 11/1012 |
| | | | 714/758 |
| 2014/0351672 A1* | 11/2014 | Marrow | H03M 13/152 |
| | | | 714/764 |
| 2015/0309875 A1* | 10/2015 | Mittelholzer | G06F 11/1012 |
| | | | 714/766 |
| 2016/0342467 A1* | 11/2016 | Kumar | G06F 11/1088 |
| 2016/0350181 A1 | 12/2016 | Cha et al. | |
| 2017/0063394 A1 | 3/2017 | Halbert et al. | |
| 2017/0194989 A1* | 7/2017 | Kumar | H03M 13/2909 |
| 2019/0012229 A1* | 1/2019 | Cha | G06F 11/1048 |

\* cited by examiner

FIG. 16
RMDa
| d0 | d1 | d2 | d3 | d4 | d5 | d6 | d7 |
|---|---|---|---|---|---|---|---|
| d8 | d9 | d10 | d11 | d12 | d13 | d14 | d15 |
| d16 | d17 | d18 | d19 | d20 | d21 | d22 | d23 |
| d24 | d25 | d26 | d27 | d28 | d29 | d30 | d31 |
| d32 | d33 | d34 | d35 | d36 | d37 | d38 | d39 |
| d40 | d41 | d42 | d43 | d44 | d45 | d46 | d47 |
| d48 | d49 | d50 | d51 | d52 | d53 | d54 | d55 |
| d56 | d57 | d58 | d59 | d60 | d61 | d62 | d63 |
| d64 | d65 | d66 | d67 | d68 | d69 | d70 | d71 |
| d72 | d73 | d74 | d75 | d76 | d77 | d78 | d79 |
| d80 | d81 | d82 | d83 | d84 | d85 | d86 | d87 |
| d88 | d89 | d90 | d91 | d92 | d93 | d94 | d95 |
| d96 | d97 | d98 | d99 | d100 | d101 | d102 | d103 |
| d104 | d105 | d106 | d107 | d108 | d109 | d110 | d111 |
| d112 | d113 | d114 | d115 | d116 | d117 | d118 | d119 |
| d120 | d121 | d122 | d123 | d124 | d125 | d126 | d127 |
— SGW1 (rows 1–4)
— SGW2 (rows 5–8)
— SGW3 (rows 9–12)
— SGW4 (rows 13–16)
CV110 XOR CV22 = CV423
 : EB
 : AEB

| CV110 | | CV22 | | CV423 |
|---|---|---|---|---|
| 0 | | 1 | | 1 |
| 0 | | 1 | | 1 |
| 0 | | 1 | | 1 |
| 0 | XOR | 1 | = | 1 |
| 0 | | 1 | | 1 |
| 1 | | 0 | | 1 |
| 0 | | 0 | | 0 |
| 1 | | 1 | | 0 |

FIG. 19

| XOR | CV12 | CV13 | CV14 | CV15 | CV16 | CV17 | CV18 | CV19 | CV110 | CV111 | CV112 | CV113 | CV114 | CV115 | CV116 | CV117 | CV118 | CV119 | CV120 | CV121 | CV122 | CV123 | CV124 | CV125 | CV126 | CV127 | CV128 | CV129 | CV130 | CV131 | CV132 |
|---|---|---|---|---|---|---|---|---|---|---|---|---|---|---|---|---|---|---|---|---|---|---|---|---|---|---|---|---|---|---|---|
| CV11 | 0 | 0 | 1 | 1 | 1 | 0 | 0 | 1 | 1 | 1 | 0 | 0 | 0 | 1 | 1 | 0 | 0 | 1 | 1 | 1 | 0 | 1 | 0 | 1 | 1 | 0 | 0 | 1 | 1 | 0 | 0 |
| | 0 | 1 | 1 | 1 | 0 | 0 | 1 | 1 | 1 | 1 | 0 | 0 | 0 | 1 | 0 | 0 | 1 | 1 | 1 | 1 | 0 | 0 | 0 | 0 | 1 | 1 | 1 | 1 | 0 | 0 | 0 |
| | 0 | 1 | 1 | 1 | 0 | 1 | 0 | 1 | 1 | 1 | 0 | 0 | 0 | 0 | 0 | 1 | 0 | 1 | 0 | 1 | 0 | 0 | 0 | 1 | 1 | 0 | 1 | 0 | 1 | 0 | 1 |
| | 0 | 1 | 1 | 0 | 0 | 0 | 1 | 1 | 1 | 0 | 0 | 1 | 0 | 1 | 1 | 1 | 1 | 0 | 0 | 0 | 0 | 0 | 1 | 1 | 1 | 0 | 1 | 1 | 0 | 1 | 0 |
| | 0 | 0 | 1 | 0 | 0 | 1 | 1 | 1 | 0 | 0 | 1 | 1 | 1 | 1 | 0 | 0 | 0 | 0 | 0 | 0 | 0 | 1 | 1 | 1 | 0 | 1 | 0 | 1 | 1 | 1 | 1 |
| | 1 | 0 | 0 | 0 | 0 | 1 | 1 | 0 | 0 | 0 | 1 | 1 | 1 | 0 | 1 | 0 | 1 | 1 | 0 | 1 | 0 | 1 | 0 | 0 | 1 | 0 | 1 | 1 | 1 | 0 | 1 |
| | 1 | 0 | 0 | 0 | 1 | 1 | 0 | 0 | 0 | 0 | 1 | 1 | 0 | 0 | 0 | 1 | 1 | 0 | 1 | 1 | 0 | 0 | 1 | 0 | 0 | 1 | 1 | 1 | 0 | 0 | 1 |
| | 1 | 1 | 0 | 1 | 1 | 1 | 0 | 0 | 1 | 1 | 1 | 0 | 1 | 0 | 1 | 1 | 1 | 0 | 0 | 0 | 0 | 1 | 1 | 0 | 0 | 1 | 1 | 0 | 0 | 0 | 1 |

SEMICONDUCTOR MEMORY DEVICE ERROR CORRECTION CIRCUIT, SEMICONDUCTOR MEMORY DEVICE INCLUDING THE SAME, AND MEMORY SYSTEM INCLUDING THE SAME

CROSS-REFERENCE TO RELATED APPLICATIONS

This application claims priority under 35 U.S.C. § 119 to Korean Patent Application No. 10-2017-0085809, filed on Jul. 6, 2017, the disclosure of which is incorporated by reference herein in its entirety.

TECHNICAL FIELD

Exemplary embodiments of the present disclosure relate to memory devices, and more particularly, to error correction circuits of semiconductor memory devices, semiconductor memory devices including the same, and memory systems including the same.

DISCUSSION OF THE RELATED ART

Semiconductor memory devices may be classified as non-volatile memory devices, such as flash memory devices, and volatile memory devices, such as dynamic random access memory (DRAM) devices. DRAM devices are often used for system memories due to their high speed operation and cost efficiency. Due to the continuing reduction in fabrication design rules of DRAM devices, bit errors of memory cells in DRAM devices may increase, and the yield of DRAM devices may decrease.

SUMMARY

Exemplary embodiments of the present disclosure provide an error correction circuit of a semiconductor memory device capable of improving performance and reliability, a semiconductor memory device including the same, and a memory system including the same.

According to exemplary embodiments of the present disclosure, an error correction circuit of a semiconductor memory device including a memory cell array includes an error correction code (ECC) memory that stores an ECC, and an ECC engine. The ECC is represented by a generation matrix. The ECC engine is configured to generate first parity data based on main data using the ECC, and to correct at least one error bit in the main data read from the memory cell array using the first parity data. The main data includes a plurality of data bits divided into a plurality of sub codeword groups. The ECC includes a plurality of column vectors divided into a plurality of code groups corresponding to the sub codeword groups. The column vectors have elements configured to restrict a location of a sub codeword group of the plurality of sub codeword groups in which a miscorrected bit occurs. The miscorrected bit is generated due to error bits in the main data.

According to exemplary embodiments of the present disclosure, a semiconductor memory device includes a memory cell array including a plurality of bank arrays. Each of the plurality of bank arrays includes a normal cell region that stores main data, and a redundancy cell region that stores first parity data associated with the main data. The semiconductor memory device further includes an error correction circuit configured to generate the first parity data based on the main data using an error correction code (ECC), and to correct at least one error bit in the main data using the first parity data. The ECC is represented by a generation matrix. The semiconductor memory device further includes a control logic circuit configured to control the error correction circuit based on a command and an address. The main data includes a plurality of data bits divided into a plurality of sub codeword groups. The ECC includes a plurality of column vectors divided into a plurality of code groups corresponding to the sub codeword groups. The column vectors have elements configured to restrict a location of a sub codeword group of the plurality of sub codeword groups in which a miscorrected bit occurs. The miscorrected bit is generated due to error bits of the main data.

According to exemplary embodiments of the present disclosure, a memory system includes a memory module including a plurality of data memories and at least one parity memory, and a memory controller configured to control the plurality of data memories and the at least one parity memory. Each of the plurality of data memories includes a memory cell array that stores a data set corresponding to a plurality of burst lengths and first parity data generated based on the data set, and an error correction circuit configured to generate the first parity data based on the data set using a first error correction code (ECC). The data set includes a plurality of data bits divided into a plurality of sub codeword groups. The first ECC includes a plurality of column vectors divided into a plurality of code groups corresponding to the sub codeword groups. The column vectors have elements configured to restrict a location of a sub codeword group of the plurality of sub codeword groups in which a miscorrected bit occurs. The miscorrected bit is generated due to error bits of the data set.

According to exemplary embodiments of the present disclosure, a method of operating a semiconductor memory device including a memory cell array includes storing an error correction code (ECC) in an error correction code memory disposed in an error correction circuit of the semiconductor memory device. The data format of the ECC is a generation matrix. The method further includes generating first parity data, by an ECC engine disposed in the error correction circuit, based on main data using the ECC. The method further includes correcting at least one error bit in the main data, by the ECC engine, using the first parity data. The main data includes a plurality of data bits divided into a plurality of sub codeword groups, and the ECC includes a plurality of column vectors divided into a plurality of code groups corresponding to the sub codeword groups. The column vectors have elements configured to restrict a location of a sub codeword group of the plurality of sub codeword groups in which a miscorrected bit occurs. The miscorrected bit is generated due to error bits in the main data.

According to exemplary embodiments of the present disclosure, an ECC is represented by a generation matrix, includes a plurality of column vectors, and the column vectors are divided into first through fourth code groups corresponding to the first through fourth sub codeword groups, respectively. The column vectors have elements configured to restrict a location of a sub codeword group in which a miscorrected bit occurs, in which the miscorrected bit is generated by error bits of the main data. As a result, performance and reliability relating to error correction may be improved.

BRIEF DESCRIPTION OF THE DRAWINGS

The above and other features of the present disclosure will become more apparent by describing in detail exemplary embodiments thereof with reference to the accompanying drawings.

FIG. 2A illustrates a data set corresponding to the plurality of burst lengths in the memory system of FIG. 1, according to exemplary embodiments of the present disclosure.

FIG. 2B illustrates second parity data corresponding to a plurality of burst lengths, which is provided to the parity memory or output from the parity memory in the memory system of FIG. 1, according to exemplary embodiments of the present disclosure.

FIG. 16 illustrates a configuration of main data read from the memory cell array in the data memory of FIG. 5, according to exemplary embodiments of the present disclosure.

FIG. 18 illustrates a result of a bitwise exclusive OR operation of the column vectors corresponding to the error bits in FIG. 16, according to exemplary embodiments of the present disclosure.

FIG. 19 illustrates a result of a bitwise exclusive OR operation of one of the column vectors and each of other column vectors in the first code group of FIG. 11A, according to exemplary embodiments of the present disclosure.

DETAILED DESCRIPTION OF THE EMBODIMENTS

Figure 1:
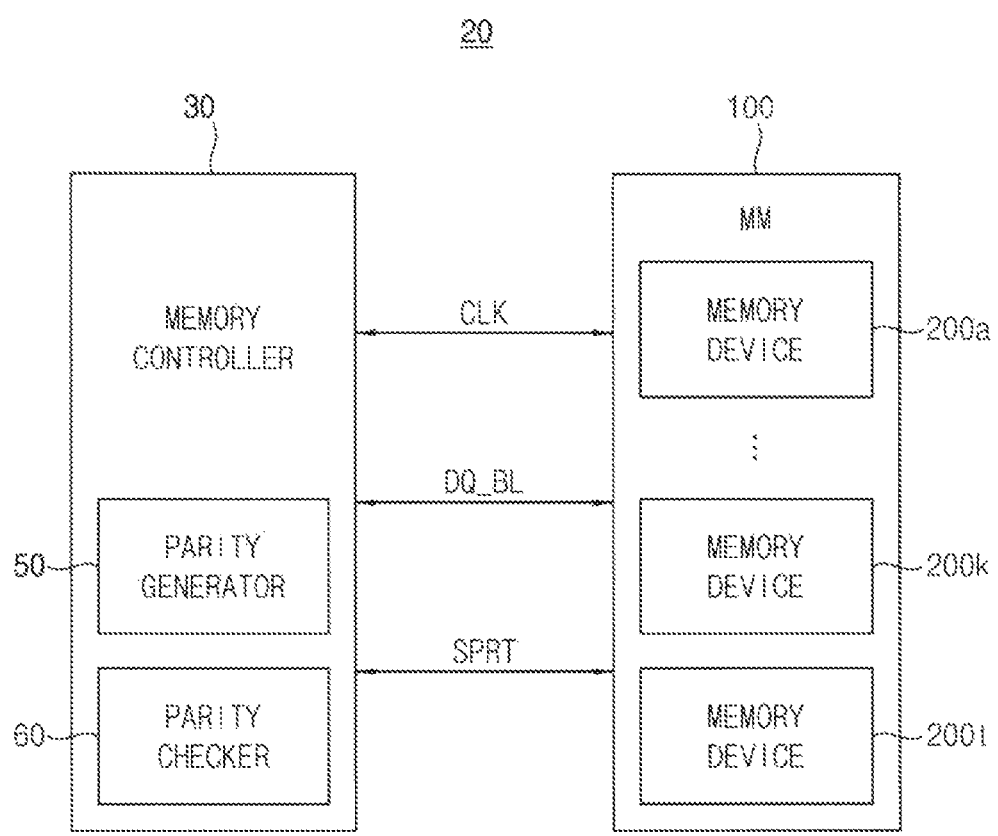
FIG. 1 is a block diagram illustrating a memory system, according to exemplary embodiments of the present disclosure.

Exemplary embodiments of the present disclosure will be described more fully hereinafter with reference to the accompanying drawings. Like reference numerals may refer to like elements throughout the accompanying drawings.

FIG. 1 is a block diagram illustrating a memory system according to exemplary embodiments of the present disclosure.

Referring to FIG. 1, a memory system 20 may include a memory controller 30 and a memory module 100. The memory module 100 includes a plurality of memory devices 200a~200k and 200t. The plurality of memory devices 200a~200k and 200t includes a plurality of data memories 200a~200k and a 200t.

The memory controller 30 may control an overall operation of the memory system 20. The memory controller 30 may control an overall data exchange between a host and the plurality of memory devices 200a~200k and 200t. For example, the memory controller 30 may write data in the plurality of memory devices 200a~200k and 200t or read data from the plurality of memory devices 200a~200k and 200t in response to a request from the host. In addition, the memory controller 30 may issue operation commands to the plurality of memory devices 200a~200k and 200t for controlling the plurality of memory devices 200a~200k and 200t.

In exemplary embodiments, each of the plurality of semiconductor memory devices 200a~200k and 200t includes dynamic memory cells such as a dynamic random access memory (DRAM). In exemplary embodiments, each of the plurality of semiconductor memory devices 200a~200k and 200t is a memory device including resistive type memory cells.

In exemplary embodiments, a number of the data memories 200a~200k may be 8 or 16. However, the number of the data memories 200a~200k is not limited thereto.

In exemplary embodiments, each of the data memories 200a~200k may be referred to as a data chip, and the parity memory 200t may be referred to as an error correction code (ECC) memory, a redundant memory, an ECC chip, or a redundant chip.

The memory controller 30 and the memory module 100 may exchange a first data set DQ_BL and a second data set SPRT in response to a clock signal CLK.

The first data set DQ_BL corresponds to a plurality of burst lengths, which is provided to/output from each of the data memories 200a~200k, and the second data set SPRT includes second parity data SPRT associated with a data set corresponding to all of the data set DQ_BL.

The memory controller 30 includes a parity generator 50 and a parity checker 60. The parity generator 50 generates the second parity data SPRT based on a user data set, and the parity checker 60 detects error bits in the user data set in units of a rank, using the second parity data SPRT.

Each of the data memories 200a~200k and the parity memory 200t may perform a burst operation. Herein, the burst operation refers to an operation of writing or reading a large amount of data by sequentially increasing or decreasing an initial address provided from the memory controller 30. A basic unit of the burst operation may be referred to a burst length BL.

In exemplary embodiments, the burst length BL refers to the number of operations of continuously reading or writing data by sequentially increasing or decreasing an initial address. For example, in the event that each of the data memories 200a~200k and the parity memory 200t is a double data rate (DDR) DRAM and a burst length thereof is 8, a burst read or write operation may be performed eight times by sequentially increasing or decreasing an initial address in response to the clock signal CLK.

Figure 2A:
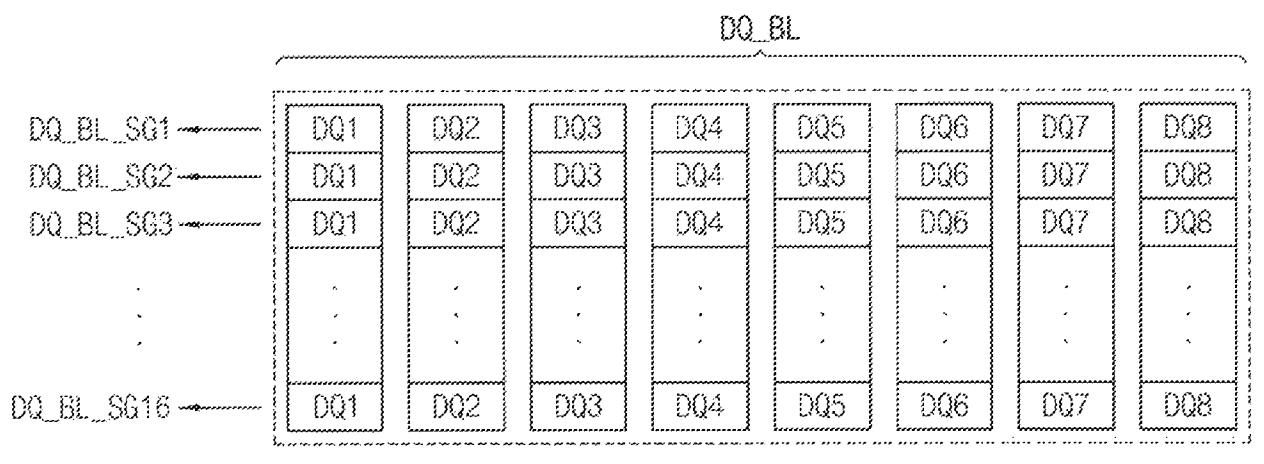

FIG. 2A illustrates a data set corresponding to the plurality of burst lengths in the memory system of FIG. 1, according to exemplary embodiments of the present disclosure.

Referring to FIG. 2A, the data set DQ_BL corresponding to the plurality of burst lengths and first parity bits CRCd associated with the data set DQ_BL are input to/output from each of the data memories 200a~200k. The data set DQ_BL includes data segments DQ_BL_SG1~DQ_BL_SG16 each corresponding to each of the plurality of burst lengths. The burst length is assumed to be 8 in FIG. 1A. However, exemplary embodiments of the present disclosure are not limited thereto. The data set DQ_BL corresponding to the plurality of burst lengths may be stored in a normal cell region of each of the data memories 200a~200k.

Figure 2B:
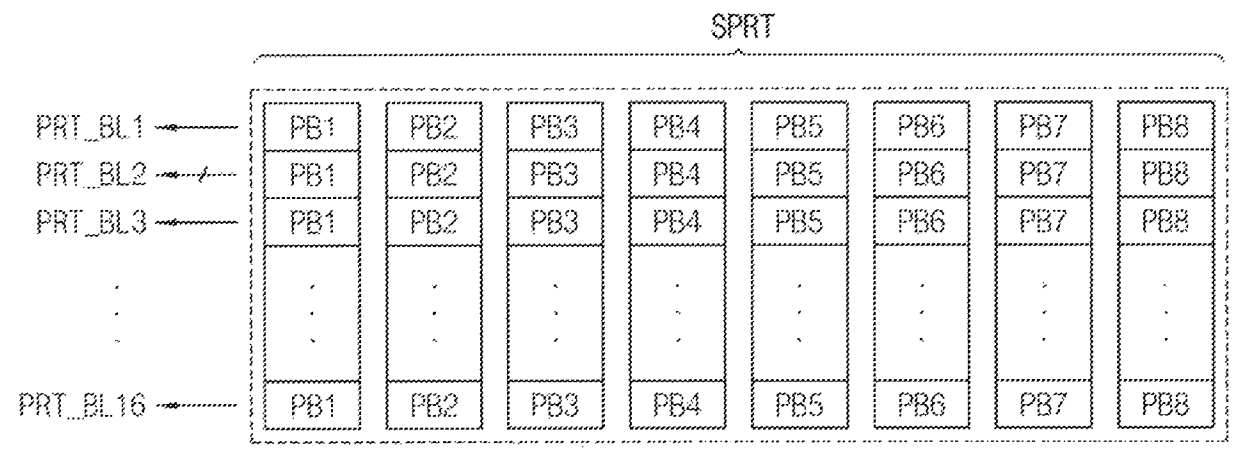

FIG. 2B illustrates second parity data corresponding to a plurality of burst lengths, which is provided to the parity memory or output from the parity memory in the memory system of FIG. 1, according to exemplary embodiments of the present disclosure.

Referring to FIG. 2B, the parity bits PRT_BL1~PRT_BL6 corresponding to one burst length are input to/output from the parity memory 200t at times corresponding to the burst length BL. The burst length is assumed to be 8 in FIG. 2B. However, exemplary embodiments of the present disclosure are not limited thereto. Each of the parity bits PRT_BL1~PRT_BL16 corresponding to one burst length may be generated based on a corresponding data segment DQ_BL_SG to be stored in each of the data memories 200a~200k.

Figure 2C:
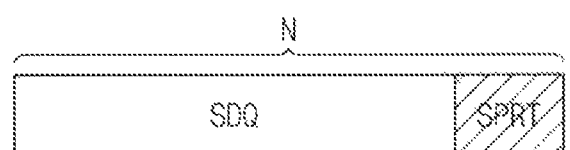
FIG. 2C is a diagram schematically illustrating structures of N-bit data in the memory system of FIG. 1, according to exemplary embodiments of the present disclosure.

FIG. 2C is a diagram schematically illustrating structures of N-bit data in the memory system of FIG. 1, according to exemplary embodiments of the present disclosure.

Referring to FIG. 2C, N-bit data includes a user data set SDQ corresponding to all of the data set DQ_BL stored in each of the data memory 200a~200k and corresponding to the burst lengths and the second parity data SPRT associated with the user data set SDQ.

Figure 3:
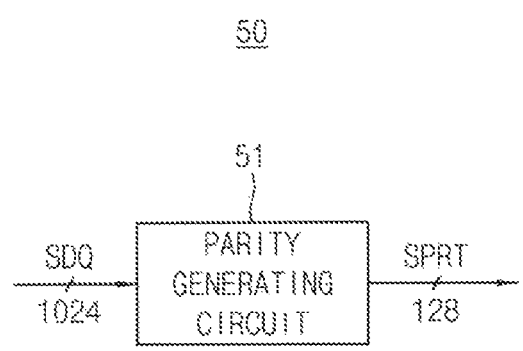
FIG. 3 is a block diagram illustrating the parity generator in the memory controller in FIG. 1, according to exemplary embodiments of the present disclosure.

FIG. 3 is a block diagram illustrating the parity generator in the memory controller in FIG. 1, according to exemplary embodiments of the present disclosure.

Referring to FIG. 3, the parity generator 50 includes a parity generating circuit 51.

The parity generating circuit 51 receives 1024-bit user data set SDQ, and generates 128-bit second parity data SPRT based on the 1024-bit user data set SDQ. The parity generating circuit 51 may be implemented, for example, with an ECC encoder. The parity bits SPRT may be stored in a write buffer. The second parity data SPRT may be provided to the memory module 100 along with the user data set SDQ.

Figure 4:
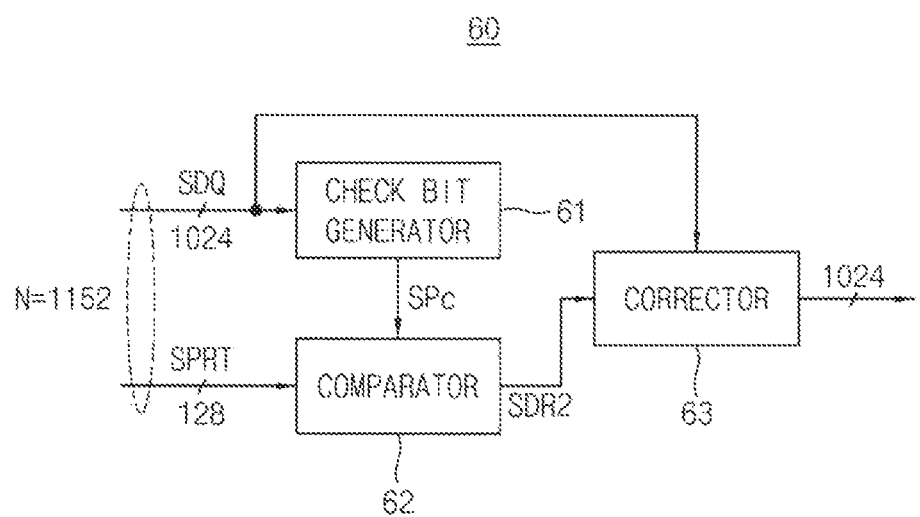
FIG. 4 is a block diagram illustrating the parity checker in the memory controller in FIG. 1, according to exemplary embodiments of the present disclosure.

FIG. 4 is a block diagram illustrating the parity checker in the memory controller in FIG. 1, according to exemplary embodiments of the present disclosure.

Referring to FIG. 4, the parity checker 60 includes a check bit generator 61, a comparator 62 and a data corrector 63.

The check bit generator 61 receives the 1024-bit user data set SDQ and generates a check bit set SPc based on the 1024-bit user data set SDQ. The comparator 62 compares corresponding bits of the 128-bit second parity data SPRT and the 128-bit parity bit set SPc in units of a rank, and generates a syndrome data SDR2 indicating whether an error bit occurs and a position of the error bit. The data corrector 63 receives the 1024-bit user data set SDQ, inverts data of the data set DQ_BL in which the error bit occurs based on the syndrome data SDR2, and corrects the error bit in the user data set SDQ. The parity checker 60 may be implemented by, for example, an ECC decoder, and may perform ECC decoding on the user data set SDQ in units of a rank using a single error correction and double error detection (SECDED) code.

Figure 5:
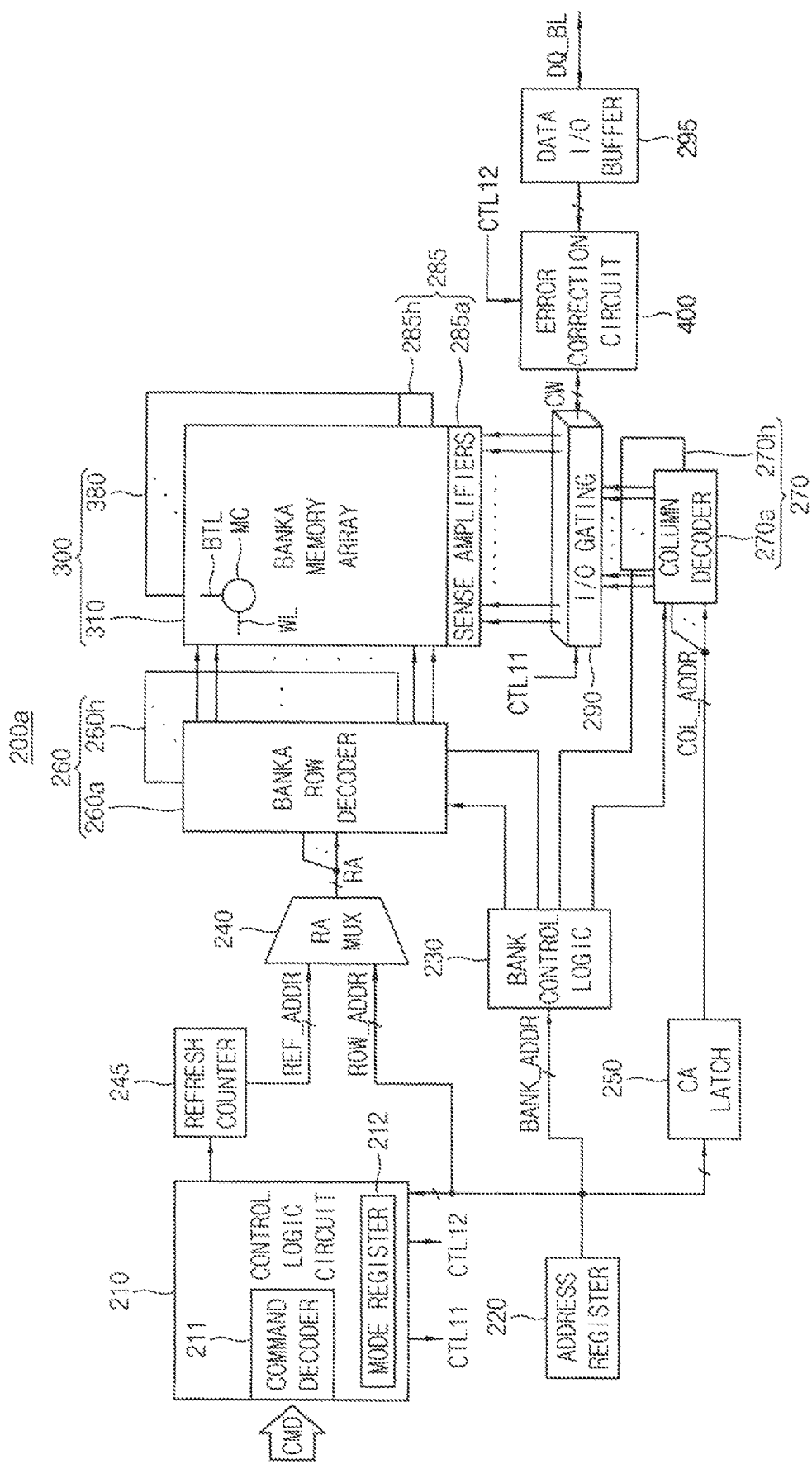
FIG. 5 is a block diagram illustrating one of the data memories in the memory module in FIG. 1, according to exemplary embodiments of the present disclosure.

FIG. 5 is a block diagram illustrating one of the data memories in the memory module in FIG. 1, according to exemplary embodiments of the present disclosure.

Although only the configuration of the data memory 200a (or semiconductor memory device 200a) is illustrated in FIG. 5, it is to be understood that the configuration of other data memories 200b~200k and the parity memory 200t is substantially the same as the configuration of the data memory 200a.

Referring to FIG. 5, the data memory 200a includes a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, and an error correction circuit 400. The data memory 200a may further include one of an ECC engine and a CRC checker.

The memory cell array 300 includes first through eighth bank arrays 310~380. The row decoder 260 includes first through eighth bank row decoders 260a~260h respectively coupled to the first through eighth bank arrays 310~380. The column decoder 270 includes first through eighth bank column decoders 270a~270h respectively coupled to the first through eighth bank arrays 310~380. The sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h, and first through eighth bank sense amplifiers 285a~285h may form first through eighth banks. Each of the first through eighth bank arrays 310~380 includes a plurality of memory cells MC coupled to word-lines WL and bit-lines BTL.

Although the data memory 200a is illustrated in FIG. 5 as including eight banks, exemplary embodiments of the present disclosure are not limited thereto, and the data memory 200a may include any number of banks.

The address register 220 receives an address ADDR including a bank address BANK_ADDR, a row address ROW_ADDR and a column address COL_ADDR, and a command CMD from the memory controller 30.

The address register 220 may provide the received bank address BANK_ADDR to the bank control logic 230, the received row address ROW_ADDR to the row address multiplexer 240, and the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output one of the row address ROW_ADDR the refresh row address REF_ADDR as a row address RA. The row address RA that is output from the row address multiplexer 240 may be applied to the first through eighth bank row decoders 260a~260h.

The activated one of the first through eighth hank row decoders 260a~260h may decode the row address RA that is output from the row address multiplexer 240, and may activate a word-line corresponding to the row address RA. For example, the activated bank row decoder may apply a word-line driving voltage to the word-line, corresponding to the row address RA.

The column address latch 250 may receive the column address COL_ADDR from the address register 220, and may temporarily store the received column address COL_ADDR. In exemplary embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 to output data corresponding to the column address COL_ADDR or a mapped column address MCA.

The I/O gating circuit 290 includes circuitry for gating input/output data. The I/O gating circuit 290 further includes read data latches for storing data that is output from the first through eighth bank arrays 310~380, and write drivers for writing data to the first through eighth bank arrays 310~380.

Codeword CW to be read from one bank array of the first through eighth bank arrays 310~380 may be sensed by a sense amplifier coupled to the one bank array from which the data is to be read, and may be stored in the read data latches.

The codeword CW stored in the read data latches is ECC-decoded by the error correction circuit 400 and may be provided to the memory controller 30 via the data I/O buffer 295.

Data (or a data set) DQ_BL to be written in one bank array of the first through eighth bank arrays 310~380 may be provided to the data I/O buffer 295 from the memory controller 30. The data DQ_BL is provided to the error correction circuit 400. The error correction circuit 400 performs ECC encoding on the data DQ_BL to generate first parity data, and provides the I/O gating circuit 290 with codeword CW including the data DQ_BL and the first parity data. The I/O gating circuit 290 may write the data DQ_BL and the first parity data in a normal cell region (a first memory region) and a redundancy cell region (a second memory region), respectively, in the one bank array, through the write drivers.

When the error correction circuit 400 performs the ECC encoding and the ECC decoding, the error correction circuit 400 may use an ECC which is represented by a generation matrix. For example, the data structure/data format of the ECC may be a generation matrix. The ECC may include a plurality of column vectors corresponding to data bits of the data (or main data) DQ_BL, and the column vectors may be divided into a plurality of code groups corresponding to a plurality of sub codeword groups. The data bits may be divided into a plurality of sub codeword groups. In addition, the column vectors may have elements configured to restrict a location of a sub codeword group in which a miscorrected bit occurs, generated by error bits of the main data. Therefore, the error correction circuit 400 may increase efficiency of rank level ECC by configuring that a sub codeword group in which the miscorrected bit occurs, generated by error bits of the main data, is not overlapped with sub codeword groups including the error bits.

The control logic circuit 210 may control operations of the data memory 200a. For example, the control logic circuit 210 may generate control signals for the data memory 200a to perform a write operation or a read operation. The control logic circuit 210 may include a command decoder 211 that decodes the command CMD received from the memory controller 30, and a mode register 212 that sets an operation mode of the data memory 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a first control signal CTL11 to control the I/O gating circuit 290, and a second control signal CTL12 to control the error correction circuit 400.

Figure 6:
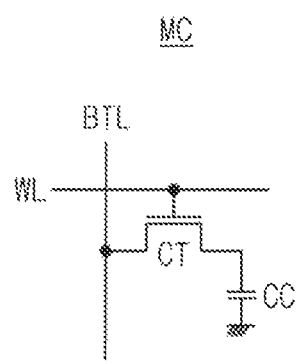
FIG. 6 is a circuit diagram of an exemplary implementation of the memory cell shown in FIG. 5, according to exemplary embodiments of the present disclosure.

FIG. 6 is a circuit diagram of an exemplary implementation of the memory cell shown in FIG. 5, according to exemplary embodiments of the present disclosure.

Referring to FIG. 6, a memory cell MC includes a cell capacitor CC and a transistor CT. The transistor CT may be a selection element (or switching element) that connects/disconnects the cell capacitor CC to/from a bit-line BTL according to a voltage of a word-line WL. The transistor CT may be coupled between the cell capacitor CC, the word-line WL and the bit-line BTL, and the cell capacitor CC may be coupled between the transistor CT and a plate voltage.

FIG. 6 illustrates the memory cell MC is implemented with a dynamic memory cell. However, exemplary embodiments of the present disclosure are not limited thereto. For example, the memory cell MC may be implemented with a resistive memory cell.

Figure 7:
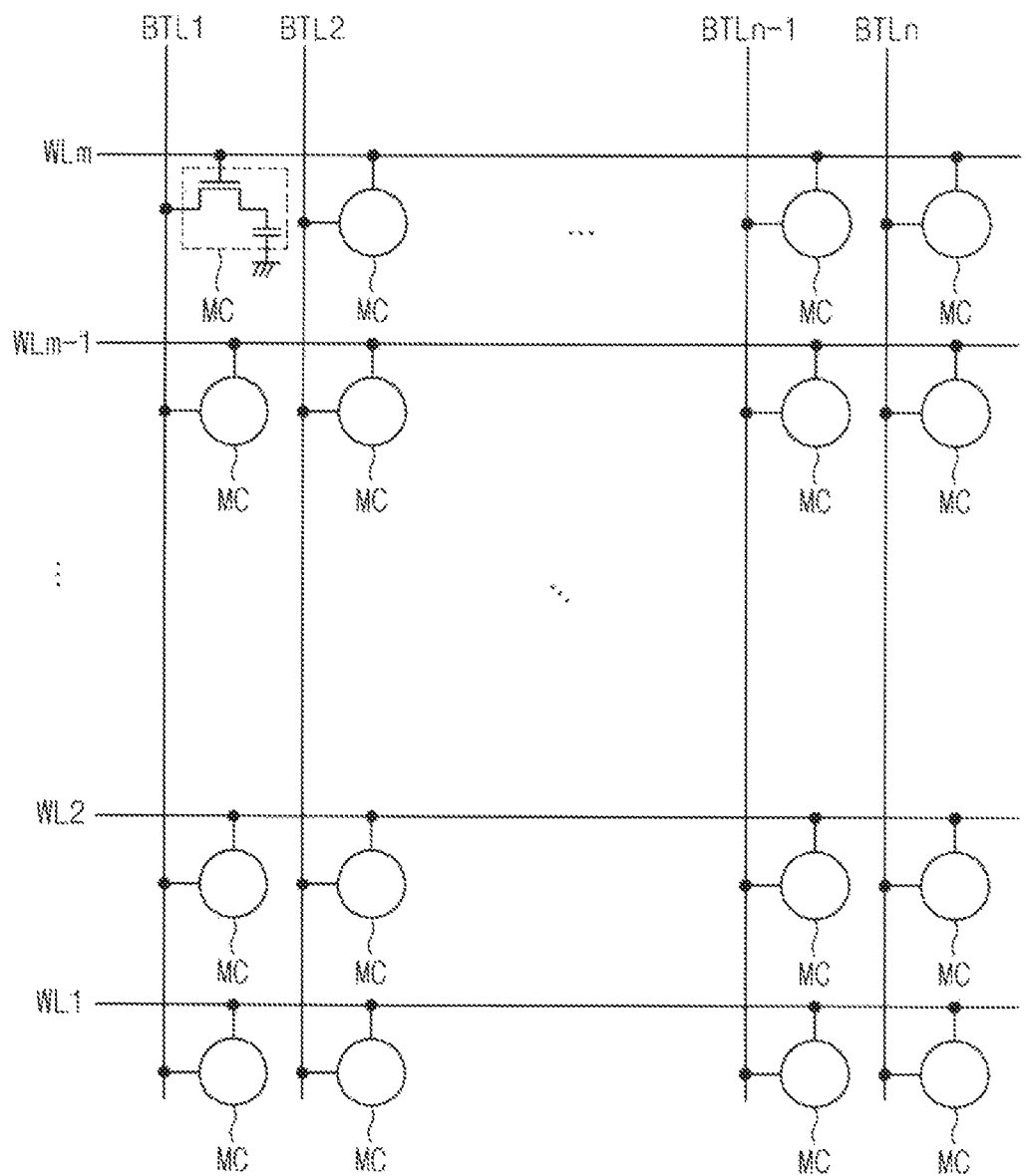
FIG. 7 illustrates an example of the first bank array in the data memory of FIG. 5, according to exemplary embodiments of the present disclosure.

FIG. 7 illustrates an example of the first bank array in the data memory of FIG. 5, according to exemplary embodiments of the present disclosure.

Referring to FIG. 7, the first bank array 310 includes a plurality of word-lines WL1~WLm (m is a natural number greater than two), a plurality of bit-lines BTL1~BTLn (n is a natural number greater than two), and a plurality of memory cells MCs disposed near intersections between the word-lines WL1~WLm and the bit-lines BTL1~BTLn. In an exemplary embodiment, each of the plurality of memory cells MCs may include a dynamic random access memory (DRAM) cell structure. The plurality of word-lines WL1~WLm to which the plurality of memory cells MCs is connected may be defined as rows of the first batik array 310, and the plurality of bit-lines BTL1~BTLn to which the plurality of memory cells MCs is connected may be defined as columns of the first bank array 310.

Figure 8:
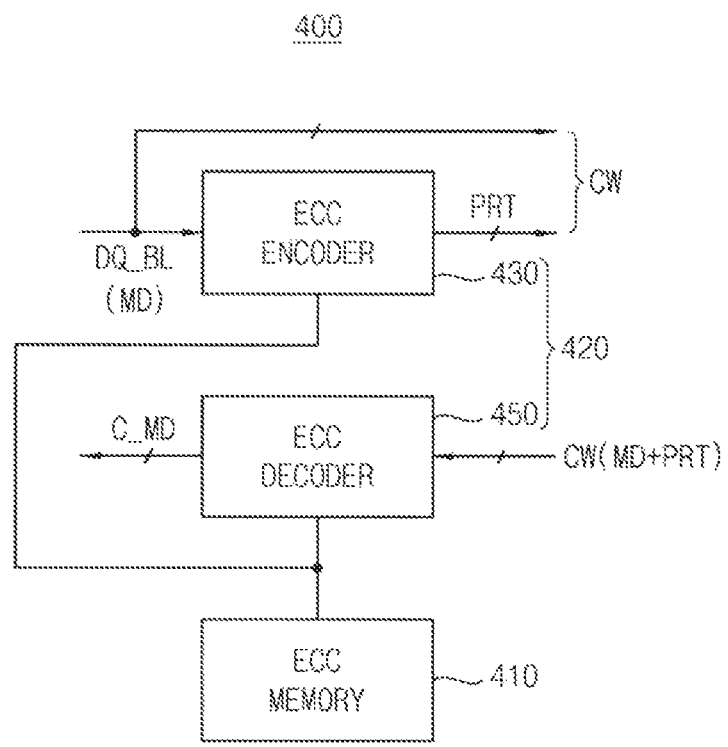
FIG. 8 is a block diagram illustrating the error correction circuit in the data memory of FIG. 5, according to exemplary embodiments of the present disclosure.

FIG. 8 is a block diagram illustration the error correction circuit in the data memory of FIG. 5, according to exemplary embodiments of the present disclosure.

Referring to FIG. 8, the error correction circuit 400 includes an ECC memory 410, an ECC encoder 430, and an ECC decoder 450. The ECC encoder 430 and the ECC decoder 450 may constitute an ECC engine 420.

The ECC memory 410 stores ECC. The ECC may be represented by a generation matrix (e.g., a data format/structure of the ECC may be a generation matrix), and may include a plurality of column vectors corresponding to data bits in the main data (e.g., Herein, the terms data DQ_BL and main data MD may be used interchangeably).

The ECC encoder 430 is coupled to the ECC memory 410, and may perform ECC encoding on the main data DQ_BL (or main data MD) using the ECC stored in the ECC memory 410 to generate first parity data PRT in a write operation of the data memory 200a. The ECC encoder 430 may provide the I/O gating circuit 290 with the codeword CW including the main data MD and the first parity data PRT.

The ECC decoder 450 is coupled to the ECC memory 410, may receive the codeword CW including the main data MD and the first parity data PRT, may perform ECC decoding on the main data MD based on the first parity data PRTR using the ECC to correct an error bit in the main data MD, and may output corrected main data C_MD.

Although it is described with reference to FIG. 8 that the ECC memory 410 is coupled to the ECC encoder 430 and the ECC decoder 450, in exemplary embodiments, the ECC memory 410 may be implemented with exclusive OR gates within the ECC encoder 430 and the ECC decoder 450.

Figure 9:
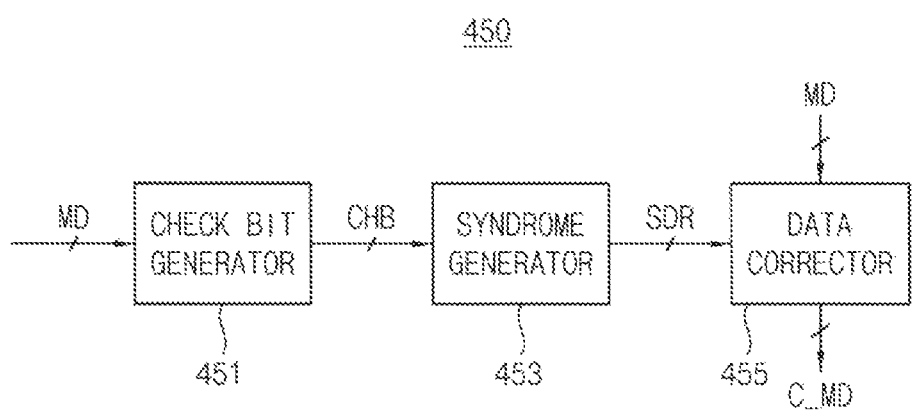
FIG. 9 is a block diagram illustrating the ECC decoder in the error correction circuit of FIG. 8, according to exemplary embodiments of the present disclosure.

FIG. 9 is a block diagram illustrating the ECC decoder in the error correction circuit of FIG. 8, according to exemplary embodiments of the present disclosure.

Referring to FIG. 9, the ECC decoder 450 includes a check bit generator 451, a syndrome generator 453, and a data corrector 455.

The check bit generator 451 generates check bits CHB based on the data bits in the main data MD using the ECC memory 410. The syndrome generator 453 generates syndrome data SDR indicating whether an error bit occurs and a position of the error bit based on a comparison of the check bits CHB and parity bits of the first parity data PRT.

The data corrector 455 receives the main data MD and the syndrome data SDR, corrects the error bit in the main data MD, and outputs the corrected main data C_MD.

In FIGS. 8 and 9, the main data MD includes $2^p$-bit of the data bits (where p is an integer equal to or greater than seven), the first parity data PRT includes (p+1)-bit parity bits, and the ECC may be used to correct q error bits of the main data MD (where q is an integer greater than zero). The ECC may be a single error correction (SEC) code.

Figure 10:
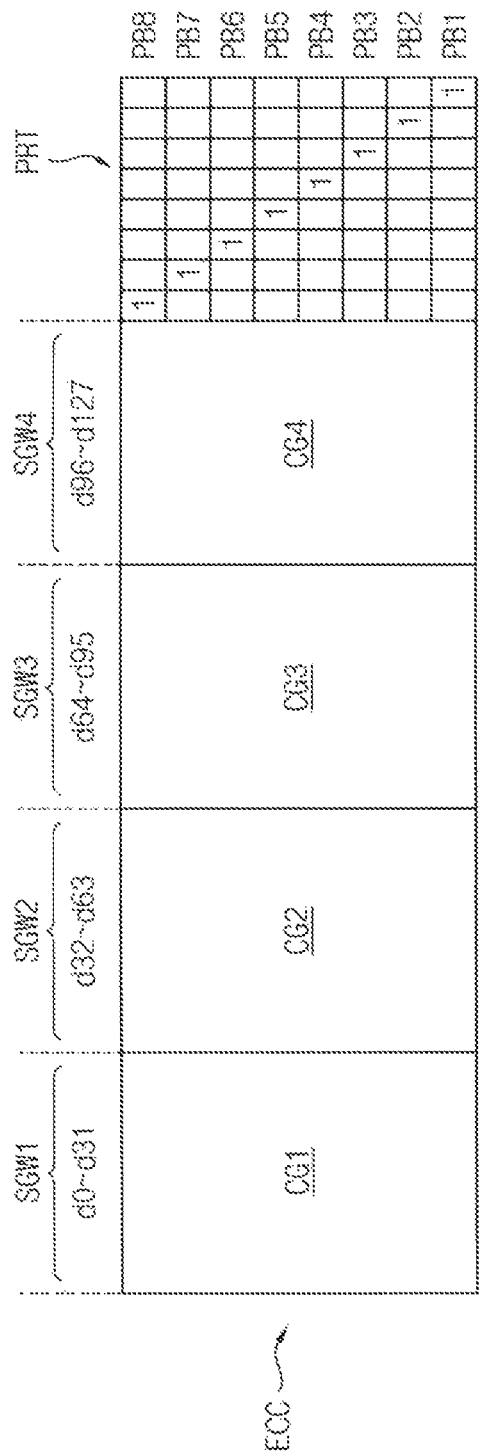
FIG. 10 illustrates relationships of the ECC, the data bits, and the parity bits used in the error correction circuit of FIG. 8, according to exemplary embodiments of the present disclosure.

FIG. 10 illustrates relationships of the ECC, the data bits, and the parity bits used in the error correction circuit of FIG. 8, according to exemplary embodiments of the present disclosure.

In FIG. 10, it is assumed that the main data MD includes 128-bit data bits d0~d127, and the first parity data PRT includes 8-bit parity bits PB1~PB8. In FIG. 10, it is assumed that p is seven.

Referring to FIG. 10, the data bits d0~d127 of the main data MD may be divided into first through fourth sub codeword groups SGW1~SGW4. The first sub codeword group SGW1 includes data bits d0~d31, the second sub codeword group SGW2 includes data bits d32~d63, the third sub codeword group SGW3 includes data bits d64~d95, and the fourth sub codeword group SGW4 includes data bits d96~d127. Each of the first through fourth sub codeword groups SGW1~SGW4 includes $2^p$-bit data bits.

In addition, the ECC (or the generation matrix) may be divided into first through fourth code groups CG1~CG4 corresponding to the first through fourth sub codeword groups SGW1~SGW4, respectively.

FIGS. 11A through 11D illustrate the code groups in FIG. 10, according to exemplary embodiments of the present disclosure.

Figure 11A:
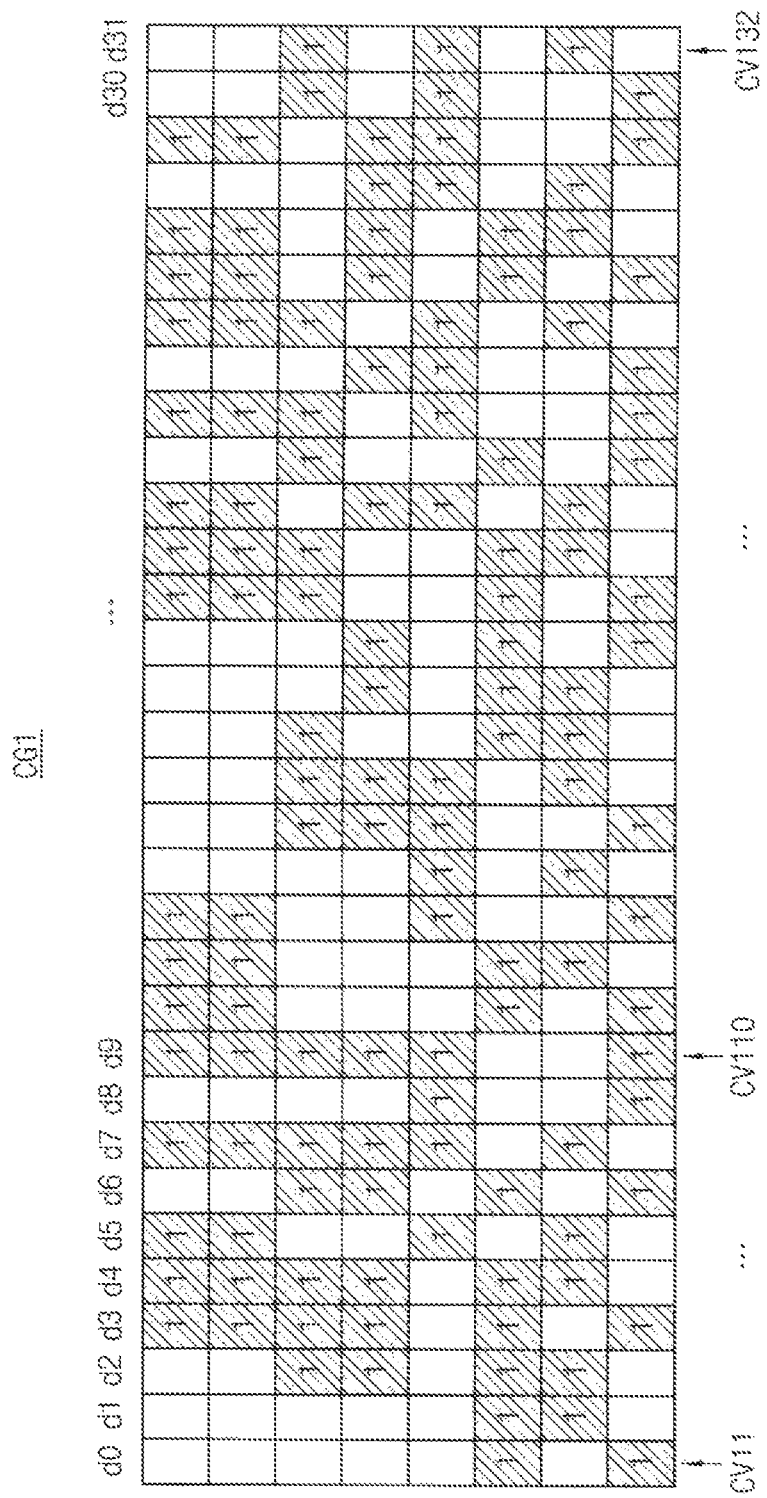
FIGS. 11A through 11D illustrates the code groups in FIG. 10, according to exemplary embodiments of the present disclosure.

Referring to FIG. 11A, the first code group CG1 includes column vectors CV11~CV132 corresponding to the data bits d0~d31 of the first sub codeword group SGW1.

Figure 11B:
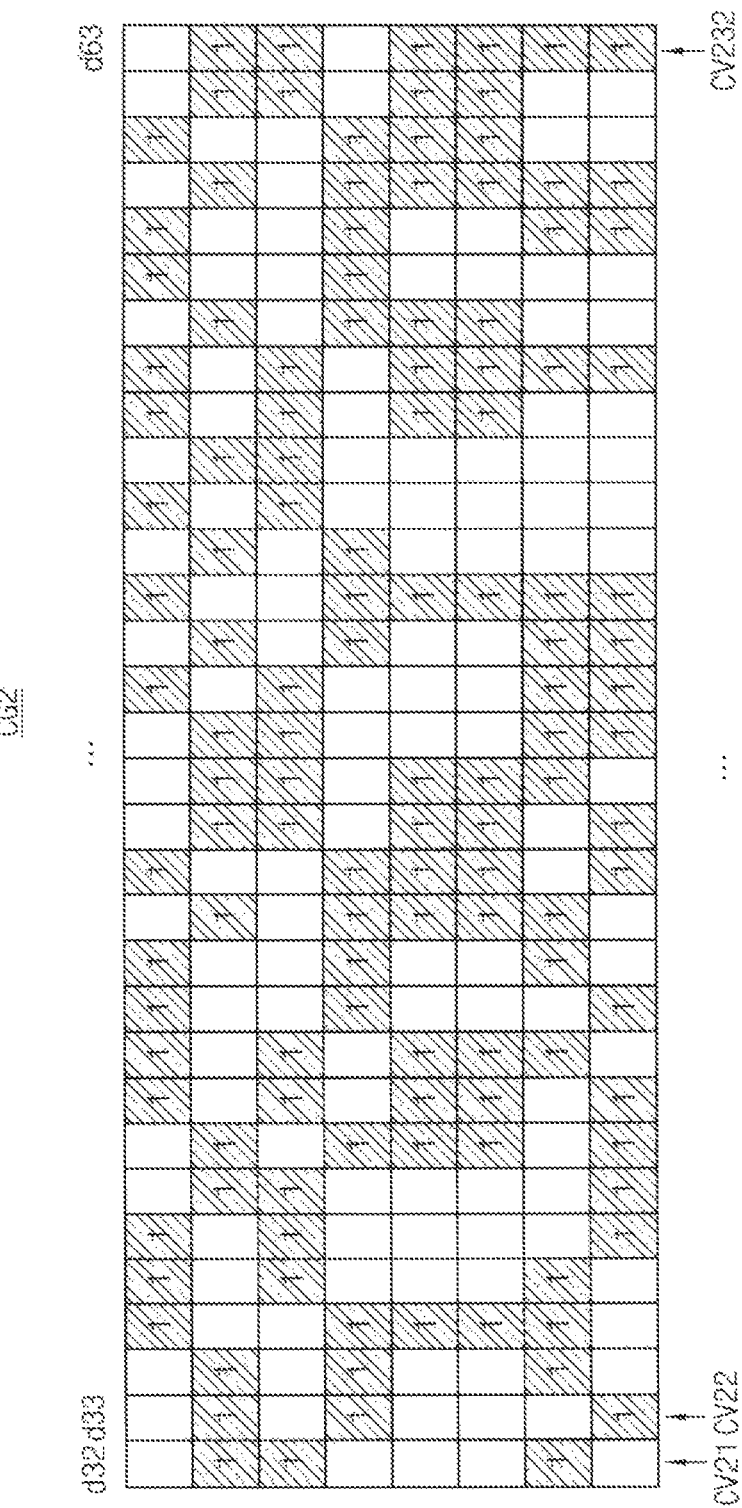

Referring to FIG. 11B, the second code group CG2 includes column vectors CV21~CV232 corresponding to the data bits d32~d63 of the second sub codeword group SGW2.

Figure 11C:
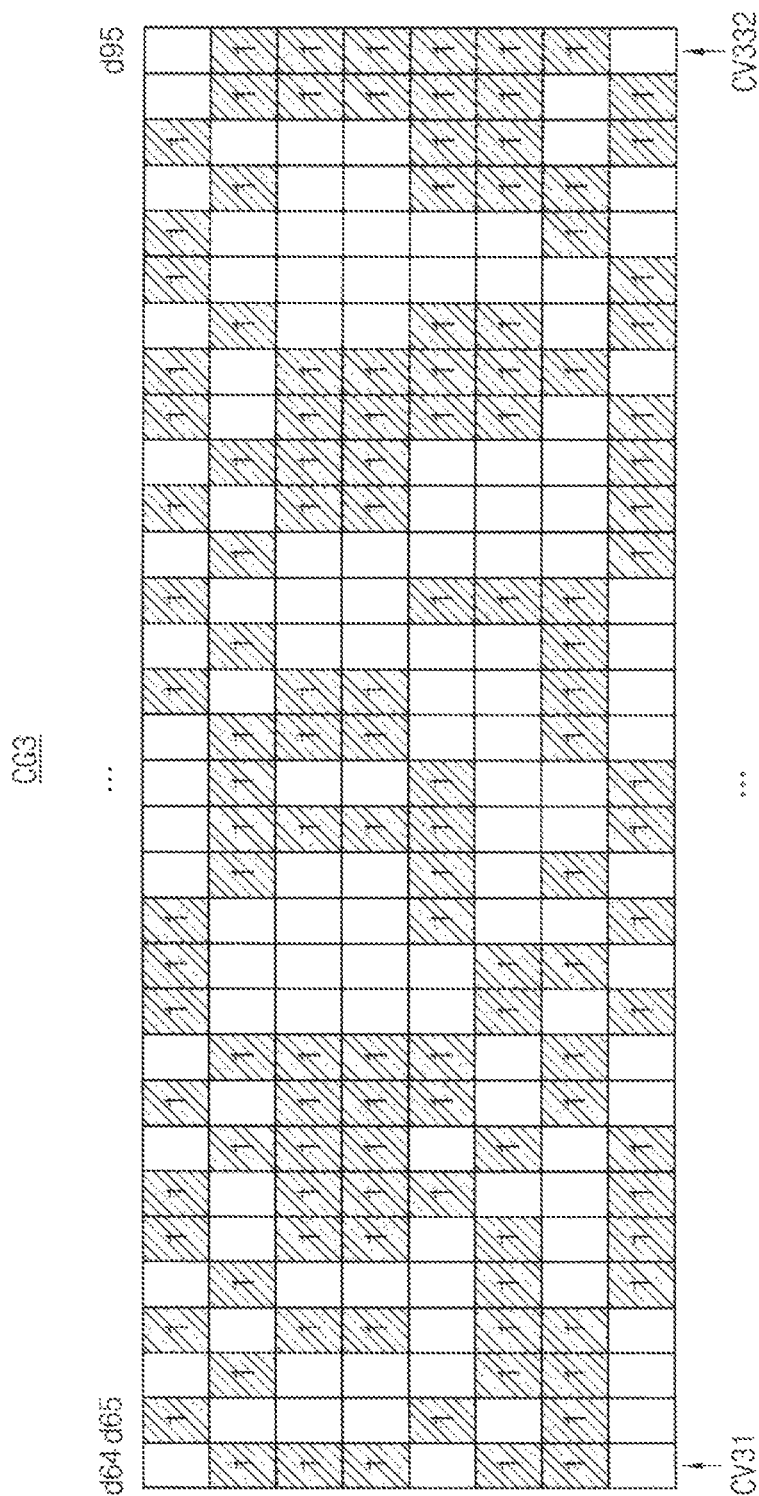

Referring to FIG. 11C, the third code group CG3 includes column vectors CV31~CV332 corresponding to the data bits d64~d95 of the third sub codeword group SGW3.

Figure 11D:
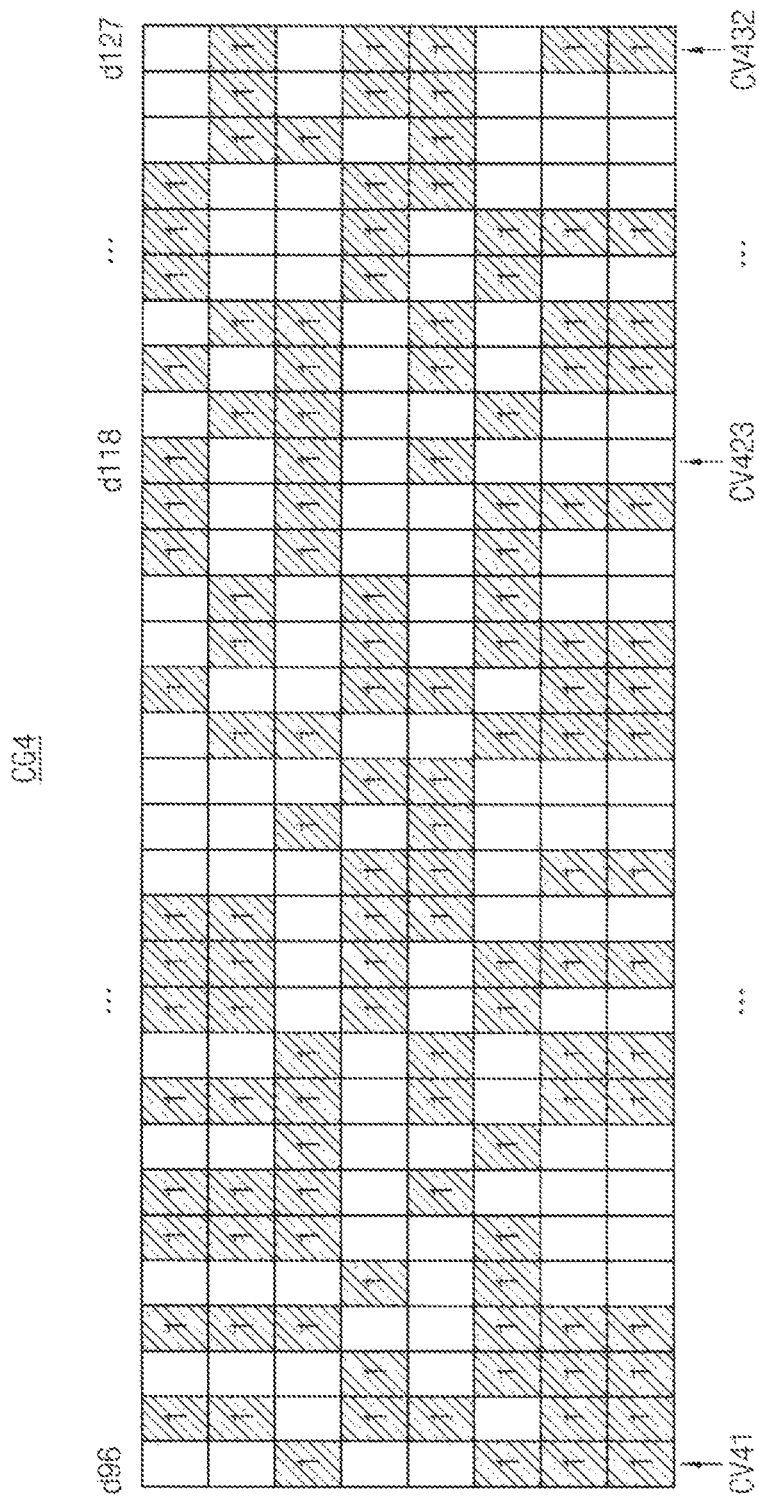

Referring to FIG. 11D, the fourth code group CG4 includes column vectors CV41~CV432 corresponding to the data bits d96~d127 of the fourth sub codeword group SGW4.

As is noted from FIGS. 11A through 11D, the column vectors CV11~CV132, CV21~CV232, CV31~CV332, and CV41~CV432 of the first through fourth code groups CG1~CG4 may have elements configured to restrict a location of a sub codeword group in which a miscorrected bit occurs, generated by error bits of the main data MD.

For example, in an exemplary scenario, the error bits of the main data MD include a first error bit and a second error bit, and one of the sub codeword groups SGW1~SGW4 includes the first error bit and the second error bit. In this case, the column vectors CV11~CV132, CV21~CV232, CV31~CV332, and CV41~CV432 of the first through fourth code groups CG1~CG4 may have elements such that each of the column vectors CV11~CV132, CV21~CV232, CV31~CV332, and CV41~CV432 differs from a result of a bit-wise exclusive OR operation of two different column vectors in the one sub codeword group including the first error bit and the second error bit.

For example, in an exemplary scenario, the error bits of the main data MD include a first error bit and a second error bit, and a first sub codeword group of the sub codeword groups SGW1~SGW4 includes the first error bit, and a second sub codeword group, different from the first sub codeword group, includes the second error bit. In this case, the column vectors CV11~CV132, CV21~CV232, CV31~CV332, and CV41~CV432 of the first through fourth code groups CG1~CG4 may have elements such that that a result of a bit-wise exclusive OR operation of each of the column vectors in a first code group corresponding to the first sub codeword group and each of the column vectors in a second code group corresponding to the second sub codeword group differs from each of the column vectors CV11~CV132, CV21~CV232, CV31~CV332 and CV41~CV432, or matches with one of the column vectors in the code groups CG1~CG4 other than the first code group and the second code group.

For example, a result of a bit-wise exclusive OR operation of the column vector CV110 in the first code group CG1 and the column vector CV22 in the second code group CG2 matches with the column vector CV423 in the fourth code group CG4.

Figure 12:
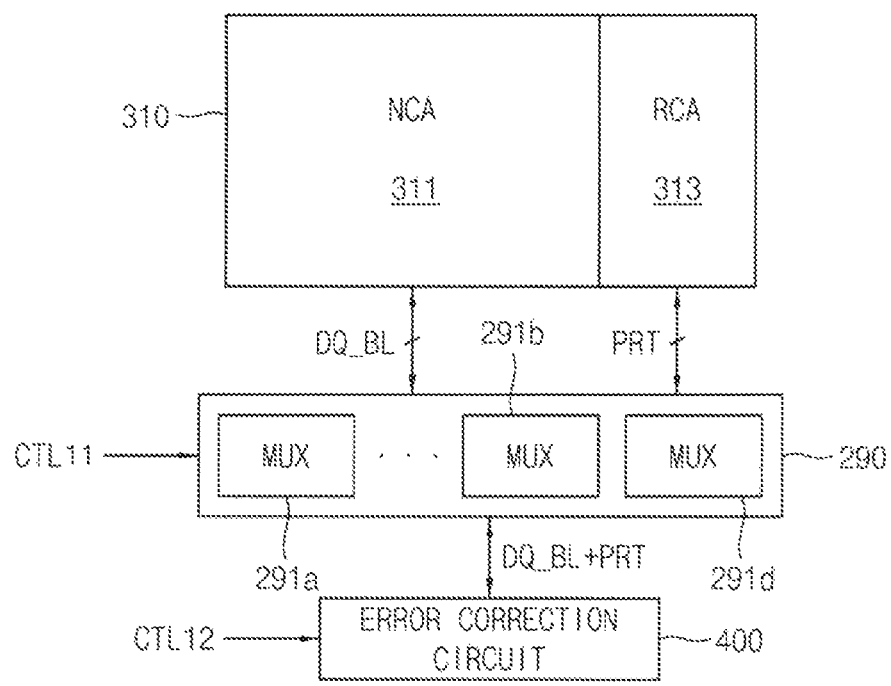
FIG. 12 illustrates the first bank array, the I/O gating circuit, and the error correction circuit in the data memory of FIG. 5, according to exemplary embodiments of the present disclosure.

FIG. 12 illustrates the first bank array, the I/O gating circuit, and the error correction circuit in the data memory of FIG. 5, according to exemplary embodiments of the present disclosure.

Referring to FIG. 12, the first bank array 310 of the data memory 200a includes a normal cell region 311 and a redundancy cell region 313.

The I/O gating circuit 290 includes a plurality of switches 291a, 291b and 291d. The plurality of switches 291a, 291b and 291d may be, for example, multiplexers. The switches 291a and 291b are connected to the normal cell region 311, and the switch 291d is connected to the redundancy cell region 313. The I/O gating circuit 290 receives the data set DQ_BL and the first parity data PRT associated with the data set DQ_BL from the error correction circuit 400, stores the data set DQ_BL in the normal cell region 311, and stores the first parity data PRT in the redundancy cell region 313.

The I/O gating circuit 290 performs the above-described operation based on the first control signal CTL11 received from the control logic circuit 210, and the error correction circuit 400 performs ECC encoding and ECC decoding based on the second control signal CTL12 received from the control logic circuit 210.

Figure 13:
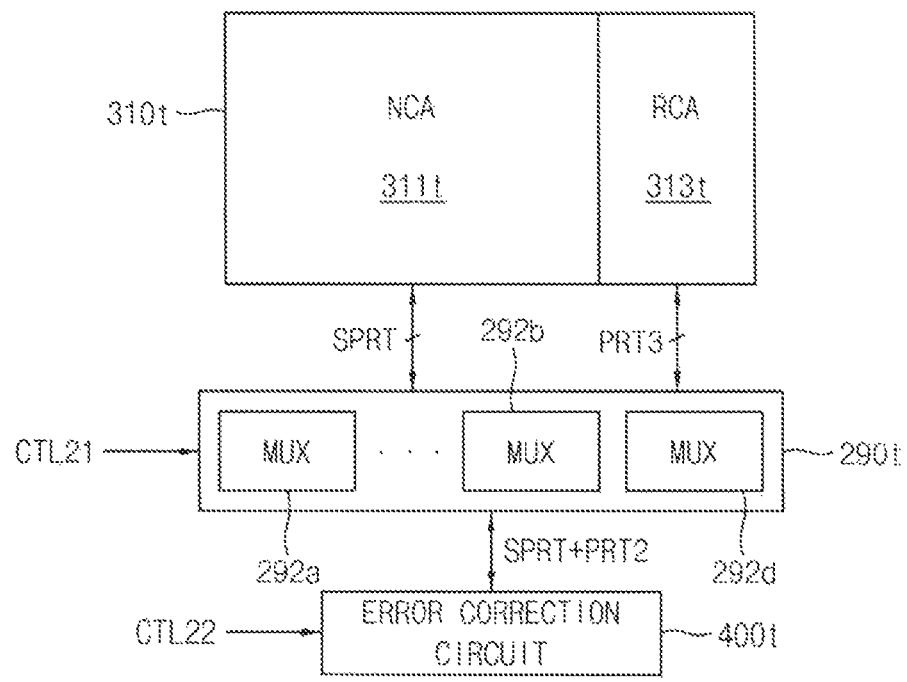
FIG. 13 illustrates a first bank array, an I/O gating circuit, and an error correction circuit in the parity memory in the memory module in FIG. 1, according to exemplary embodiments of the present disclosure.

FIG. 13 illustrates a first bank array, an I/O gating circuit, and an error correction circuit in the parity memory in the memory module in FIG. 1, according to exemplary embodiments of the present disclosure.

Referring to FIG. 13, a first bank array 310t of the parity memory 200t includes a first parity region 311t and a second parity region 313t.

An I/O gating circuit 290t includes a plurality of switches 292a, 292b and 292d. The switches 292a and 292b are connected to the first parity region 311t, and the switch 292d is connected to the second parity region 313t. The I/O gating circuit 290t receives the second parity data SPRT and third parity data PRT3 associated with the second parity data SPRT from an error correction circuit 400t in the parity memory 200t, stores the second parity data SPRT in the first parity region 311t, and stores the third parity data PRT3 in the second parity region 313t.

The I/O gating circuit 290t performs the above-described operation based on a first control signal CTL21 received from a control logic circuit in the parity memory 200t, and the error correction circuit 400t performs ECC encoding and ECC decoding based on a second control signal CTL22 from the control logic circuit.

Figure 14:
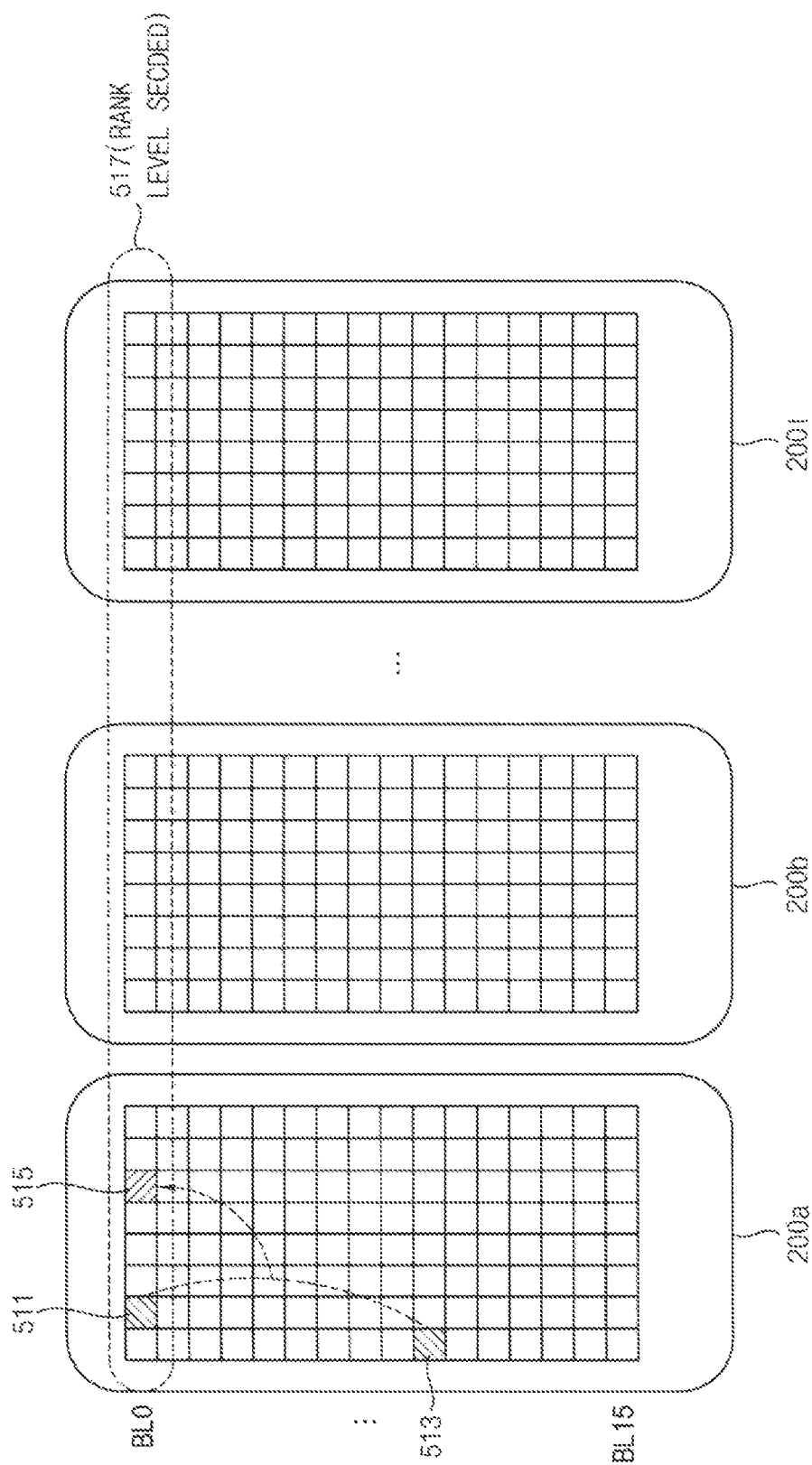
FIG. 14 illustrates that an error correction operation is performed in units of a rank in the memory module of FIG. 1, according to exemplary embodiments of the present disclosure.

FIG. 14 illustrates that an error correction operation is performed in units of a rank in the memory module of FIG. 1, according to exemplary embodiments of the present disclosure.

Referring to FIG. 14, each of the data memories 200a~200k stores 128-bit data bits, and the parity memory 200t stores 8-bit parity data in units of a rank with respect to the data bits stored in the data memories 200a~200k. Therefore, the parity memory 200t stores 128-bit parity data for all ranks.

For example, when the data memory 200a includes a first error bit 511 and a second error bit 513, and a miscorrected bit 515 due to the first error bit 511 and the second error bit 513 is included in a rank level codeword 517, the rank level codeword 517 includes the first error bit 511 and the miscorrected bit 515, and thus, the memory controller 30 cannot correct error bits of the codeword 517. A miscorrected bit may refer to a bit that has been erroneously corrected in an attempt to correct the bit. For example, the miscorrected bit 515 may be erroneously corrected in an attempt to correct the bit as a result of the first error bit 511 and the second error bit 513 being incorrect.

Figure 15:
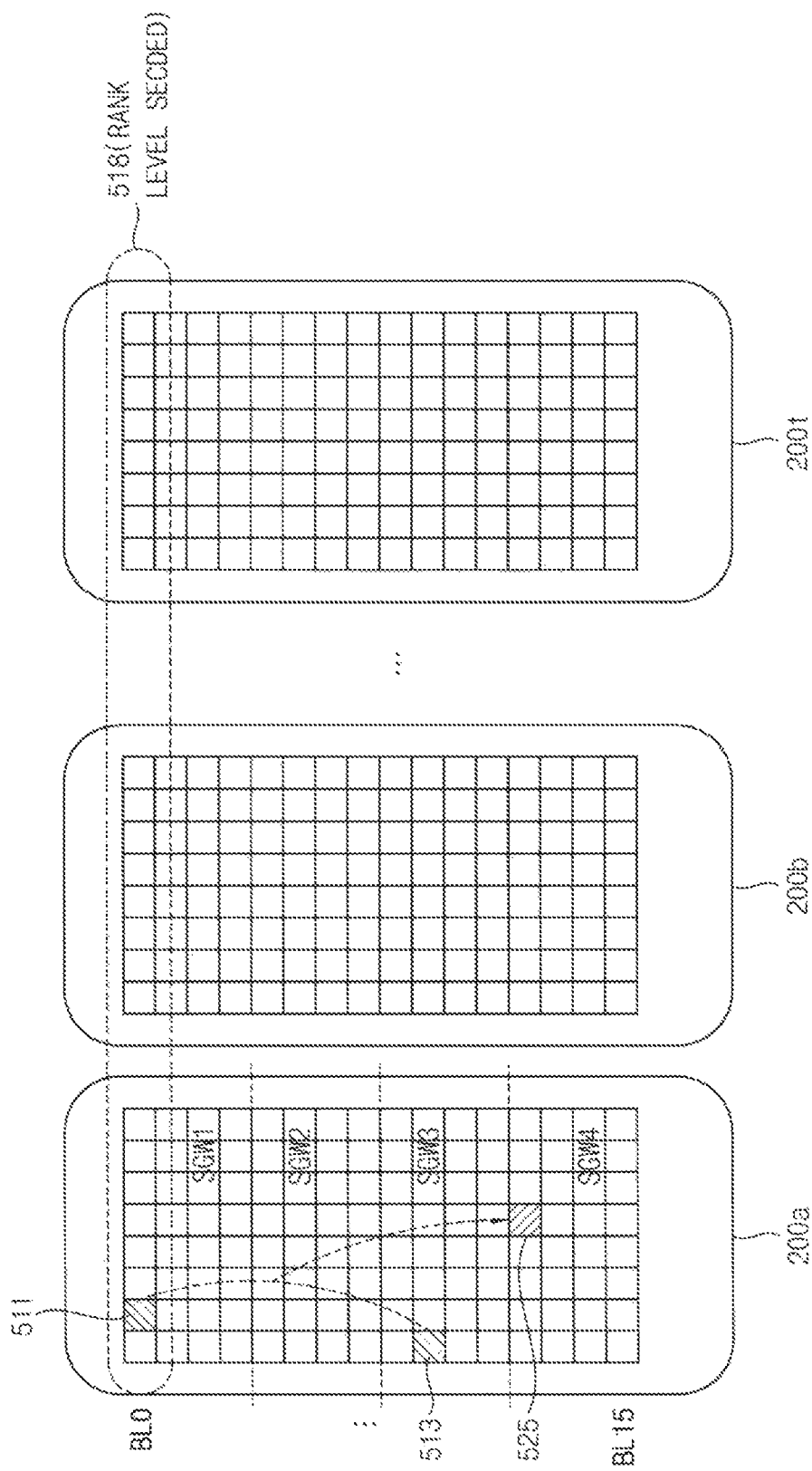
FIG. 15 illustrates that an error correction operation is performed in units of a rank in the memory module of FIG. 1, according to exemplary embodiments of the present disclosure.

FIG. 15 illustrates that an error correction operation is performed in units of a rank in the memory module of FIG. 1, according to exemplary embodiments of the present disclosure.

Referring to FIG. 15, each of the data memories 200a~200k stores 128-bit data bits, and the parity memory 200t stores 8-bit parity data in units of a rank with respect to the data bits stored in the data memories 200a~200k. Therefore, the parity memory 200t stores 128-bit parity data for all ranks.

For example, when the data memory 200a includes a first error bit 511 and a second error bit 513, and the column vectors of the ECC in the ECC memory 410 of the data memory 200a have elements configured to restrict a location of a sub codeword group in which a miscorrected bit occurs (e.g., a miscorrected bit generated as a result of error bits in the main data). For example, in FIG. 15, a miscorrected bit 525 due to the first error bit 511 and the second error bit 513 is included in the fourth sub codeword group SGW4. Therefore, the rank level codeword 518 only includes the first error bit 511, and the memory controller 30 can correct the error bit of the rank level codeword 518, by using 8-bit parity bits.

FIG. 16 illustrates a configuration of main data read from the memory cell array in the data memory of FIG. 5, according to exemplary embodiments of the present disclosure.

Referring to FIG. 16, data bits d0~d127 of read main data RMDa may be divided into the first through fourth sub codeword groups SGW1~SGW4. The first sub codeword group SGW1 includes data bits d0~d31, the second sub codeword group SGW2 includes data bits d32~d63, the third sub codeword group SGW3 includes data bits d64~d95, and the fourth sub codeword group SGW4 includes data bits d96~d127.

When the data bit d9 of the first sub codeword group SGW1 and the data bit d33 of the second sub codeword group SGW2 are error bits EB, a result of a bitwise exclusive OR operation of the column vector CV110, corresponding to the data bit d9 of the first code group CG1, and the column vector CV22, corresponding to the data bit d33 of the second code group CG2, matches with the column vector CV423 of the fourth code group CG4. A miscorrected bit AEB due to the error bits EB is included in the fourth sub codeword group SGW4. Accordingly, since the miscorrected bit AEB due to the error bits EB is included in other sub codeword group except the codeword groups including the error bits EB, the memory controller 30 may detect and/or correct error bits in a rank level codeword, by using the parity bits.

Figure 17:
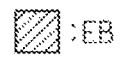
FIG. 17 illustrates a configuration of main data read from the memory cell array in the data memory of FIG. 5, according to exemplary embodiments of the present disclosure.

FIG. 17 illustrates a configuration of main data read from the memory cell array in the data memory of FIG. 5, according to exemplary embodiments of the present disclosure.

Referring to FIG. 17, data bits d0~d127 of read main data RMDb may be divided into the first through fourth sub codeword groups SGW1~SGW4.

When the data bits d0 and d9 of the first sub codeword group SGW1 are error bits, a result of a bitwise exclusive OR operation of the column vector CV11, corresponding to the data bit d0 of the first code group CG1, and the column vector CV110, corresponding to the data bit d9 of the first code group CG1, matches with none of the column vectors of the first through fourth code groups CG1~CG4. Accordingly, since the miscorrected bit AEB due to the error bits EB is not included in the sub codeword groups including the error bits EB and other sub codeword group except the sub codeword groups including the error bits EB, the memory controller 30 may detect and/or correct error bits in a rank level codeword, by using the parity bits.

FIG. 18 illustrates a result of a bitwise exclusive OR operation of the column vectors corresponding to the error bits in FIG. 16, according to exemplary embodiments of the present disclosure.

Referring to FIG. 18, it is noted that a result of a bitwise exclusive OR operation of the column vector CV110, corresponding to the data bit d9 of the first code group CG1, and the column vector CV22, corresponding to the data bit d33 of the second code group CG2, matches with the column vector CV423 of the fourth code group CG4.

FIG. 19 illustrates a result of a bitwise exclusive OR operation of one of the column vectors and each of other column vectors in the first code group of FIG. 11A, according to exemplary embodiments of the present disclosure.

Referring to FIG. 19, each result of a bitwise exclusive OR operation of the column vector CV11 and each of other column vectors CV12~CV132 in the first code group CG1 of FIG. 11A matches with none of the column vectors in the first through fourth code groups CG1~CG4.

Although two column vectors in the first code group CG1 are referred to for convenience of explanation, it is to be understood that each result of a bitwise exclusive OR operation of any two column vectors in each of the second through fourth code groups CG2~CG4 matches with none of the column vectors in the first through fourth code groups CG1~CG4. As a result, when each of the first through fourth sub codeword groups SGW1~SGW4 includes two error bits, a miscorrected bit is not included in each of the first through fourth code groups CG1~CG4. Therefore, the memory controller 30 may detect and/or correct error bits in a rank level codeword, by using the parity bits.

Figure 20:
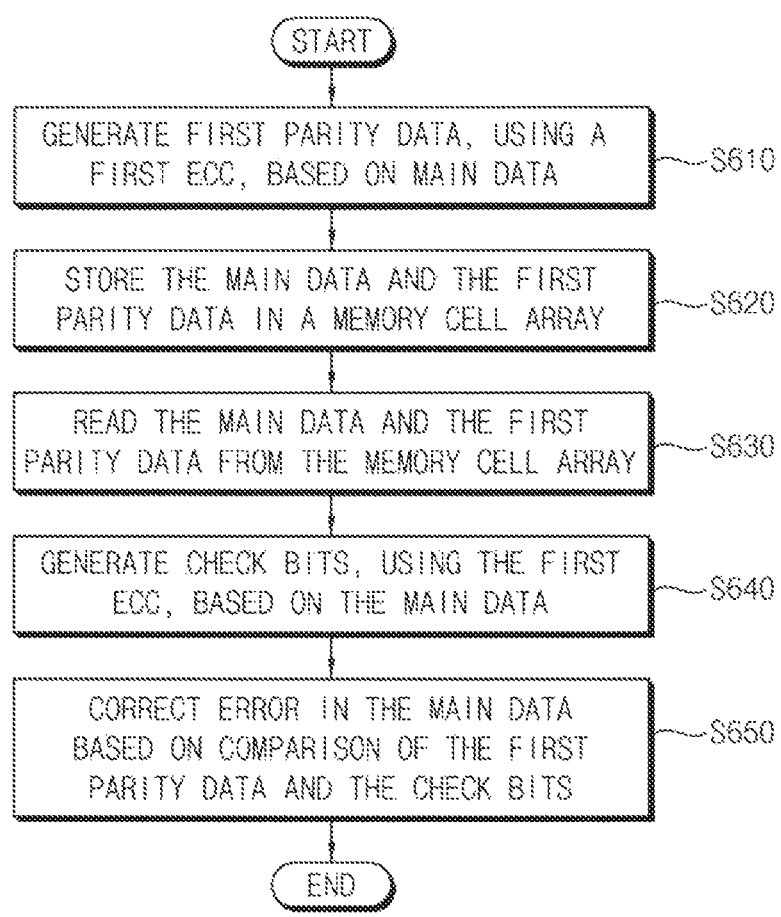
FIG. 20 is a flow chart illustrating a method of operating a semiconductor memory device, according to exemplary embodiments of the present disclosure.

FIG. 20 is a flow chart illustrating a method of operating a semiconductor memory device, according to exemplary embodiments of the present disclosure.

Referring to FIGS. 5 through 20, in a method of operating a semiconductor memory device 200a including a memory cell array 300, an error correction circuit 400 generates a first parity data PRT based on the main data MD, by using a first ECC (S610). The main data MD includes 2p-bit of data bits (where p is an integer equal to or greater than seven), the first parity data PRT includes (p+1)-bit parity bits, and the data bits of the main data MI) may be divided into first through fourth sub codeword groups, each including 2p-2 bits. The first ECC may be represented by a generation matrix, may include a plurality of column vectors, and the column vectors may be divided into first through fourth code groups corresponding to the first through fourth sub codeword groups, respectively. The column vectors may have elements configured to restrict a location of a sub codeword group in which a miscorrected bit occurs, in which the miscorrected bit is generated by error bits of the main data.

The error correction circuit 400 stores the main data MD and the first parity data PRT in the memory cell array 300 via an I/O gating circuit 290 (S620). The error correction circuit 400 reads the main data MD and the first parity data PRT from the memory cell array 300 via the I/O gating circuit 290 (S630). The error correction circuit 400 generates check bits CHB based on the main data MD, by using the first ECC (S640). The error correction circuit 400 corrects an error bit in the main data MD based on a comparison of the first parity data PRT and the check bits CHB (S650).

When the main data MD includes a first error bit and a second error bit, and the first error bit and the second error bit are included in one sub codeword group, a miscorrected bit due to the first error bit and the second error bit is not included in any of the sub codeword groups, as a result of the column vectors in the first ECC having the above-described configuration. In addition, when the first error bit and the second error bit are in two different sub codeword groups, respectively, the miscorrected bit due to the first error bit and the second error bit is not included in any of the sub codeword groups, or is included in one of the codeword groups other than the two different sub codeword groups. Therefore, the memory controller 30 may detect and/or correct error bits in a rank level codeword, by using the parity bits.

Figure 21:
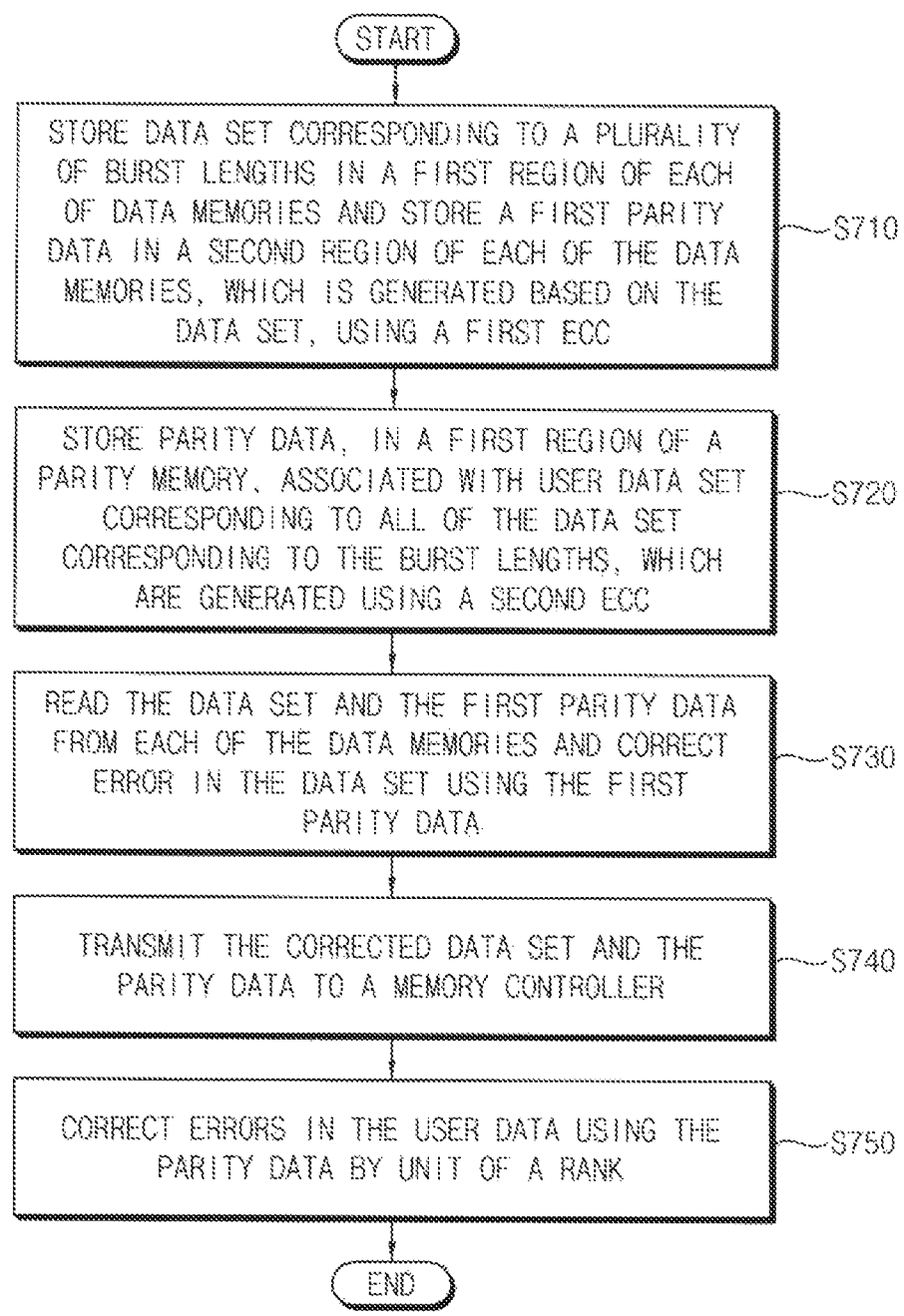
FIG. 21 is a flow chart illustrating a method of operating a memory system, according to exemplary embodiments of the present disclosure.

FIG. 21 is a flow chart illustrating a method of operating a memory system, according to exemplary embodiments of the present disclosure.

Referring to FIGS. 1 through 19 and 21, in a method of operating a memory system 20 including a memory module 100 having a plurality of data memories 200a~200k and a parity memory 200t, and a memory controller 30 that controls the memory module 100, the memory controller 30 stores a data set DQ_BL corresponding to a plurality of burst lengths respectively, in a normal cell region 311, and each of the data memories 200a~200k stores first parity data PRT associated with the data set DQ_BL in a redundancy cell region 313 (S710).

The memory controller 30 stores second parity data SPRT associated with user data set SDQ corresponding to all of the data set DQ_BL to be stored in each of the data memories 200a~200k in a first parity region 311t in the parity memory 200t, and the parity memory 200t stores third parity data PRT3 associated with the second parity data SPRT, by using the first ECC in a second parity region 313t (S720).

The error correction circuit 400 in each of the data memories 200a~200k reads the data set DQ_BL and the first parity data PRT1, and corrects an error hit in the data set DQ_BL using the first ECC and the first parity data PRT (S730).

The data memories 200a~200k and the parity memory 200t transmit the data sets DQ_BL and the second parity data SPRT to the memory controller 30, respectively (S740). The memory controller 30 detects and/or corrects an error bit in the data sets DQ_BL in a rank level by using a second ECC and the second parity data SPRT (S750).

As described above, the first ECC may be represented by a generation matrix and may include a plurality of column vectors, and the column vectors may be divided into first through fourth code groups corresponding to the first through fourth sub codeword groups, respectively. The column vectors may have elements configured to restrict a location of a sub codeword group in which a miscorrected bit occurs, in which the miscorrected bit is generated by error bits of the main data.

In addition, the first ECC may be an SEC code and the second ECC may be an SECDED code.

Figure 22:
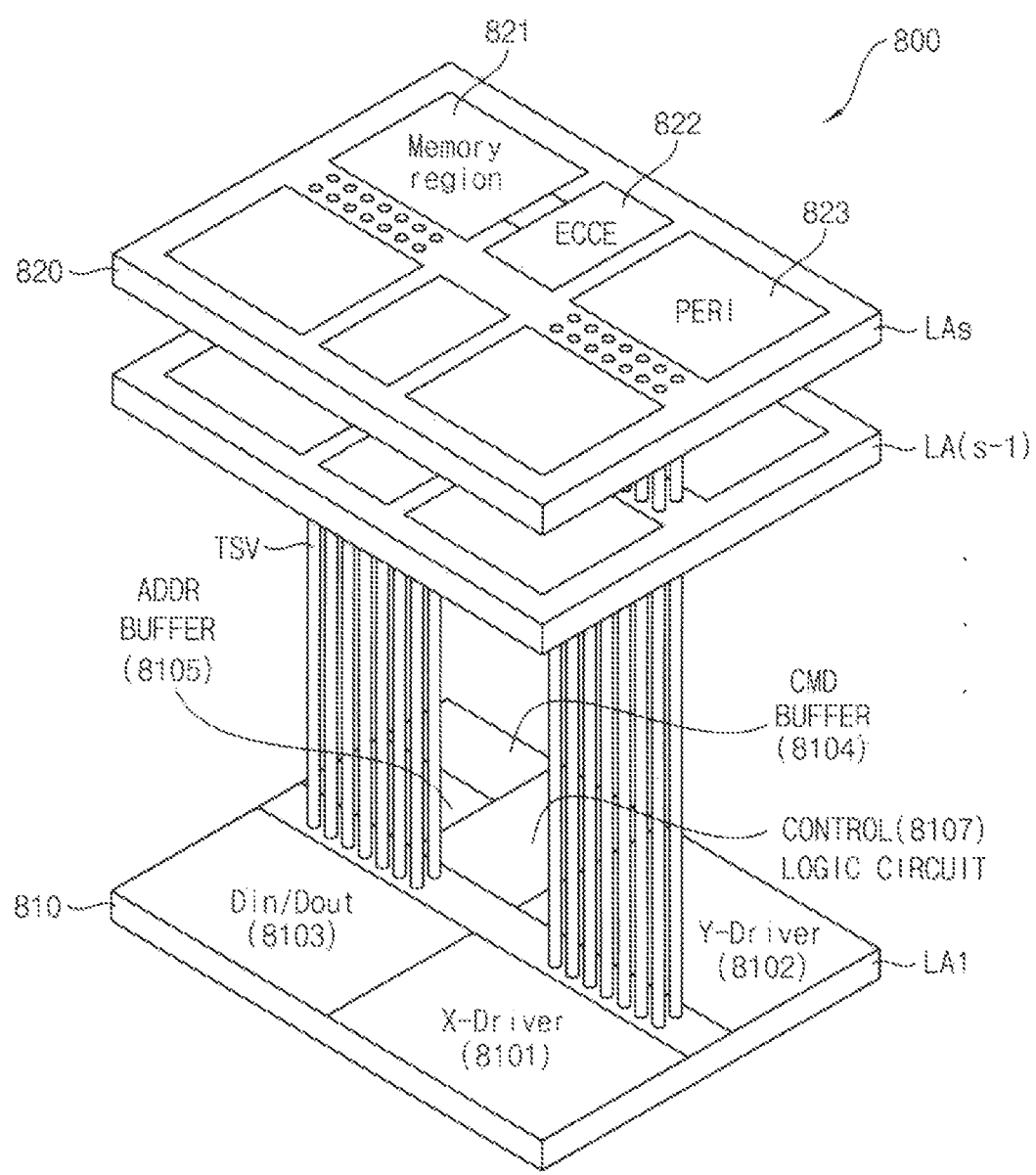
FIG. 22 is a structural diagram illustrating a memory device, according to exemplary embodiments of the present disclosure.

FIG. 22 is a structural diagram illustrating a memory device, according to exemplary embodiments of the present disclosure.

Referring to FIG. 22, a memory device 800 may include first through s-th semiconductor integrated circuit layers LA1 through LAs (s is a natural number greater than two), in which the lowest first semiconductor integrated circuit layer LA1 is an interface or control chip, and the other semiconductor integrated circuit layers LA2 through LAs are slave chips including core memory chips. The first through s-th semiconductor integrated circuit layers LA1 through LAs may transmit and receive signals therebetween through through-silicon-vias (TSVs). The lowest first semiconductor integrated circuit layer LA1 that is the interface or control chip may communicate with an external memory controller through a conductive structure formed on an external surface. A description will be made herein regarding the structure and operation of the memory device 800 by mainly using the first semiconductor integrated circuit layer LA1 (or 810) as the interface or control chip, and the s-th semiconductor integrated circuit layer LAs (or 820) as the slave chip.

The first semiconductor integrated circuit layer 810 may include various peripheral circuits for driving a memory region 821 provided in the s-th semiconductor integrated circuit layer 820. For example, the first semiconductor integrated circuit layer 810 may include a row (X) driver 8101 for driving word-lines of a memory, a column (Y)-driver 8102 for driving bit-lines of the memory, a data input/output unit (Din/Dout) 8103 for controlling input/output of data, a command buffer (CMD BUFFER) 8104 for receiving a command CMD from outside and buffering the command CMD, and an address buffer (ADDR BUFFER) 8105 for receiving an address from the memory controller.

The first semiconductor integrated circuit layer 810 may further include a control logic circuit 8107. The control logic circuit 8107 may access the memory region 821 and may generate control signals for accessing the memory region 821 based on the command from the memory controller.

The s-th semiconductor integrated circuit layer 820 may include the memory region 821 an ECC engine (ECCE) 822 that performs ECC encoding and ECC decoding on data of the memory region 821, and a peripheral region (PERI) 823 in which peripheral circuits such as, for example, a row decoder, a column decoder, and a bit-line sense amplifier are disposed for writing/reading data in the memory region 821.

As described with reference to FIGS. 2 through 19, the ECC engine 822 performs the ECC encoding and the ECC decoding using a first ECC. The first ECC may be represented by a generation matrix and may include a plurality of column vectors, and the column vectors may be divided into first through fourth code groups corresponding to the first through fourth sub codeword groups, respectively. The column vectors may have elements configured to restrict a location of a sub codeword group in which a miscorrected bit occurs, in which the miscorrected bit is generated by error bits of the main data. Therefore, the semiconductor memory device 800 may increase efficiency of error correction.

In addition, in exemplary embodiments, a three dimensional (3D) memory array is provided in the semiconductor memory device 800. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 23:
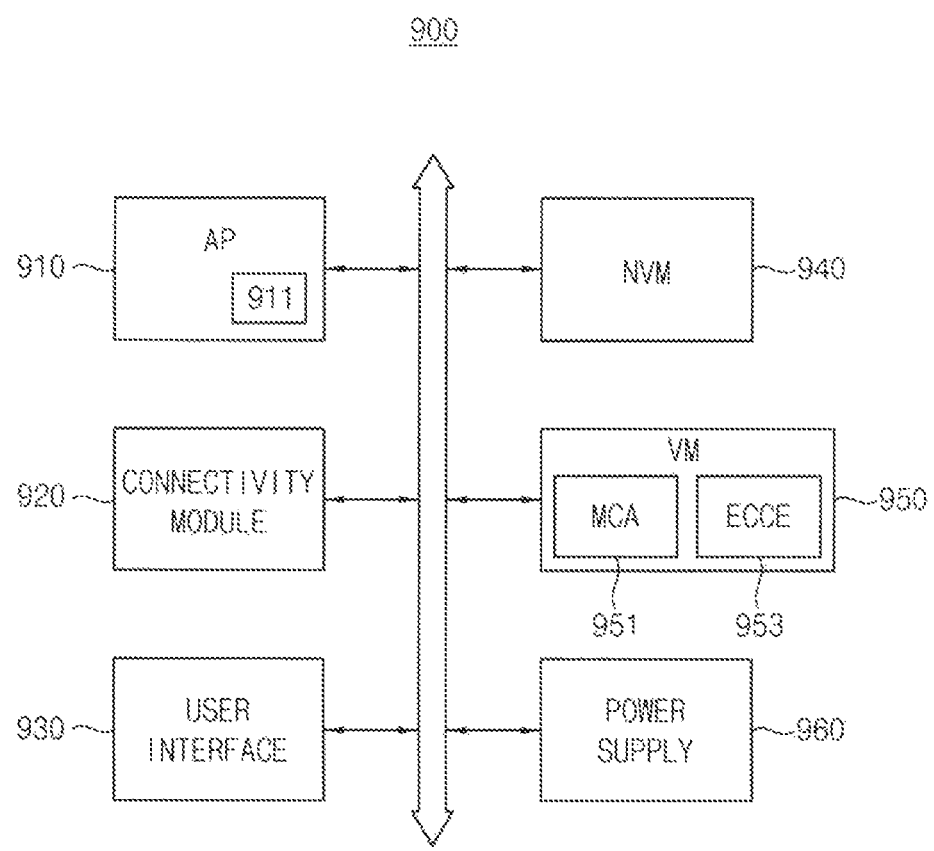
FIG. 23 is a block diagram illustrating a mobile system including the semiconductor memory device, according to exemplary embodiments of the present disclosure.

FIG. 23 is a block diagram illustrating a mobile system including the semiconductor memory device, according to exemplary embodiments of the present disclosure.

Referring to FIG. 23, a mobile system 900 may include an application processor 910, a connectivity module 920, a volatile memory device 950, a nonvolatile memory device 940, a user interface 930, and a power supply 960. The application processor 910 includes a memory controller 911.

The application processor 910 may execute applications such as, for example, a web browser, a game application, a video player, etc. The connectivity module 920 may perform wired or wireless communication with an external device. The volatile memory device 950 may store data processed by the application processor 910 or operate as a working memory. The volatile memory device 950 may employ the semiconductor memory device 200a of FIG. 5. The volatile memory device 950 includes a memory cell array 951 and an ECC engine 953.

The nonvolatile memory device 940 may store a boot image for booting the mobile system 900. The user interface 930 may include at least one input device such as, for example, a keypad, a touch screen, etc., and at least one output device such as, for example, a speaker, a display device, etc. The power supply 960 may supply a power supply voltage to the mobile system 900.

In exemplary embodiments, the mobile system 900 and/or components of the mobile device 900 may be packaged in various forms.

As described above, according to exemplary embodiments of the present disclosure, the error correction circuit performs ECC encoding and ECC decoding using a first ECC. The first ECC may be represented by a generation matrix and may include a plurality of column vectors, and the column vectors may be divided into first through fourth code groups corresponding to the first through fourth sub codeword groups, respectively. The column vectors may have elements configured to restrict a location of a sub codeword group in which a miscorrected bit occurs, in which the miscorrected bit is generated by error bits of the main data. Therefore, performance and credibility of error correction may be improved.

Exemplary embodiments of the present disclosure may be applied to semiconductor memory devices and memory systems employing the ECC circuit described herein.

As is traditional in the field of the present disclosure, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the present disclosure. Further, the blocks, units and/or modules of the exemplary embodiments may be physically combined into more complex blocks, units and/or modules without departing from the scope of the present disclosure.

While the present disclosure has been particularly shown and described with reference to the exemplary embodiments thereof, it will be understood by those of ordinary skill in the art a that various changes in form and detail may be made therein without departing from the spirit and scope of the present disclosure as defined by the following claims.

What is claimed is:

1. An error correction circuit of a semiconductor memory device comprising a memory cell array, wherein the error correction circuit comprises:
    an error correction code (ECC) memory that stores an ECC, wherein the ECC is represented by a generation matrix; and
    an ECC engine configured to generate first parity data based on main data using the ECC, and to correct at least one error bit in the main data read from the memory cell array using the first parity data, wherein the at least one error bit comprises a first error hit and a second error bit,
    wherein the main data includes a plurality of data bits divided into a plurality of sub codeword groups,
    wherein the ECC includes a plurality of column vectors divided into a plurality of code groups corresponding to the sub codeword groups,
    wherein a first code group corresponding to a first sub codeword group includes a plurality of first column vectors, and a second code group corresponding to a second sub codeword group includes a plurality of second column vectors,
    wherein, when the first sub codeword group includes the first error bit and the second sub codeword group includes the second error bit, the first column vectors and the second column vectors are arranged in bit configurations such that a result of a bit-wise exclusive OR operation of each of the first column vectors and each of the second column, vectors matches with one of the column vectors in the code groups other than the first code group and the second code group.

2. The error correction circuit of claim 1, wherein:
    when the first sub codeword group includes the first error bit and the second error bit, the first column vectors are arranged in bit configurations such that a result of the bit-wise exclusive OR operation of two different column vectors of the first column vectors differs from each of the column vectors in the code groups.

3. The error correction circuit of claim 1, wherein:
    the main data includes $2^p$-bit of the data bits, wherein p is an integer equal to or greater than seven;
    the first parity data includes (p+1)-bit parity bits;
    the ECC is a single error correction (SEC) code;
    the sub codeword groups include the first sub codeword group, the second sub codeword group, a third sub codeword group, and a fourth sub codeword group, and each of the first through fourth sub codeword groups includes $2^{p-2}$ bits; and
    the code groups include be first code group, the second code group, a third code group, and a fourth code group corresponding to the first through fourth sub codeword groups, respectively.

4. The error correction circuit of claim 3, wherein:
    each of the first through fourth code groups includes first through $2^{p-2}$-th column vectors; and
    each of the first through $2^{p-2}$-th column vectors includes (p+1) elements.

5. The error correction circuit of claim 1, wherein:
    the error correction circuit uses the ECC to correct q error bits of the main data, wherein q is an integer greater than zero; and
    the column vectors in the code groups have elements such that a sub codeword group of the plurality of sub codeword groups including a miscorrected bit generated by (q+1) error bits of the main data differs from at least one sub codeword group of the plurality of sub codeword groups including the (q+1) error bits,
    wherein the miscorrected bit is a bit that has been erroneously corrected due to error bits in the main data.

6. The error correction circuit of claim 1, wherein the ECC engine comprises:
    an ECC encoder configured to perform an ECC encoding operation on the main data using the ECC to generate the first parity data in a write operation of the semiconductor memory device; and
    an ECC decoder configured to perform an ECC decoding operation on the main data based on the first parity data using the ECC in a read operation of the semiconductor memory device.

7. The error correction circuit of claim 6, wherein the ECC decoder comprises:
    a check bit generator configured to generate check bits based on the main data using the ECC;
    a syndrome generator configured to generate syndrome data based on a comparison of the check bits and the first parity data; and
    a data corrector configured to correct the at least one error bit in the main data.

8. A semiconductor memory device, comprising:
    a memory cell array including a plurality of bank arrays, wherein each of the plurality of bank arrays includes a normal cell region that stores main data, and a redundancy cell region that stores first parity data associated with the main data;
    an error correction circuit configured to generate the first parity data based on the main data using an error correction code (ECC), and to correct at least one error bit in the main data using the first parity data, wherein the ECC is represented by a generation matrix and the at least one error bit comprises a first error it and a second error bit; and
    a control logic circuit configured to control the error correction circuit based on a command and an address,
    wherein the main data includes a plurality of data bits divided into a plurality of sub codeword groups,
    wherein the ECC includes a plurality of column vectors divided into a plurality of code groups corresponding to the sub codeword groups,
    wherein a first code group corresponding to a first sub codeword group includes a plurality of first column vectors, and a second code group corresponding to a second sub codeword group includes a plurality of second column vectors, wherein, when the first sub codeword group includes the first error bit and the second sub codeword group includes the second error bit, the first column vectors and the second column vectors are arranged in bit configurations such that a result of a bit-wise exclusive OR operation of each of the first column vectors and each of the second column vectors matches with one of the column vectors in the code groups other than the first code group and the second code group.

9. The semiconductor memory device of claim 8, wherein:
when the first sub codeword group includes the first error bit and the second error bit, the first column vectors are arranged in bit configurations such that a result of the bit-wise exclusive OR operation of two different column vectors of the first column vectors differs from each of the column vectors in the code groups.

10. The semiconductor memory device of claim 8, wherein:
the main data includes $2^p$-bit of the data bits, wherein p is an integer equal to or greater than seven;
the first parity data includes (p+1)-bit parity bits;
the ECC is a single error correction (SEC) code;
the sub codeword groups include the first sub codeword group, the second sub codeword group, a third sub codeword group, and a fourth sub codeword group, and each of the first through fourth sub codeword groups includes $2^{p-2}$ bits; and
the code groups include the first code group, the second code group, a third code group, and a fourth code group corresponding to the first through fourth sub codeword groups, respectively.

11. The semiconductor memory device of claim 8, wherein:
the memory cell array includes a plurality of dynamic memory cells coupled to a plurality of word-lines and a plurality of bit-lines; and
the memory cell array is a three-dimensional memory cell array.

12. A memory system, comprising:
a memory module including a plurality of data memories and at least one parity memory; and
a memory controller configured to control the plurality of data memories and the at least one parity memory,
wherein each of the plurality of data memories includes a memory cell array that stores a data set corresponding to a plurality of burst lengths and first parity data generated based on the data set, and an error correction circuit configured to generate the first parity data based on the data set using a first error correction code (ECC),
wherein the data set includes a plurality of data bits divided into a plurality of sub codeword groups,
wherein the first ECC includes a plurality of column vectors divided into a plurality of code groups corresponding to the sub codeword groups,
wherein a first code group corresponding to a first sub codeword group includes a plurality of first column vectors, and a second code group corresponding to a second sub codeword group includes a plurality of second column vectors,
wherein when the first sub codeword group includes a first error bit and the second sub codeword group includes a second error bit the first column vectors and the second column vectors are arranged in bit configurations such that a result of a bit-wise exclusive OR operation of each of the first column vectors and each of the second column vectors matches with one of the column vectors in the code groups other than the first code group and the second code group.

13. The memory system of claim 12, wherein the at least one parity memory is configured to store second parity data associated with a user data set corresponding to each data set stored in each of the data memories, and
wherein the memory controller is configured to generate the second parity data based on the user data set using a second ECC, and to transmit the second parity data to the at least one parity memory.

14. The memory system of claim 13, wherein:
the first ECC is a single error correction (SEC) code; and
the second ECC is a single error correction and double error detection (SECDED) code.

15. The memory system of claim 13, wherein:
the data set includes $2^p$-bit of the data bits, wherein p is an integer equal to or greater than seven;
the first parity data includes (p+1)-bit parity bits;
the sub codeword groups include the first sub codeword group, the second sub codeword group, a third sub codeword group, and a fourth sub codeword group, and each of the first through fourth sub codeword groups includes $2^{p-2}$ bits;
the code groups include the first code group, the second code group, a third code group, and a fourth code group corresponding to the first through fourth sub codeword groups, respectively;
each of the first through fourth code groups includes first through $2^{p-2}$-th column vectors; and
each of the first through $2^{p-2}$-th column vectors includes (p+1) elements.

16. The memory system of claim 15, wherein the memory controller is configured to correct at least one error bit of the data set of the data memories in units of a rank using (p+1) parity bits of the second parity data.

* * * * *